(12) United States Patent
Arita et al.

(10) Patent No.: US 7,708,860 B2
(45) Date of Patent: May 4, 2010

(54) PLASMA PROCESSING APPARATUS

(75) Inventors: Kiyoshi Arita, Munakata-gun (JP); Tetsuhiro Iwai, Kasuga (JP); Akira Nakagawa, Saga (JP)

(73) Assignee: Panasonic Corporation, Osaka (JP)

( * ) Notice: Subject to any disclaimer, the term of this patent is extended or adjusted under 35 U.S.C. 154(b) by 330 days.

(21) Appl. No.: 10/561,421

(22) PCT Filed: Jul. 22, 2004

(86) PCT No.: PCT/JP2004/010785

§ 371 (c)(1), (2), (4) Date: Dec. 19, 2005

(87) PCT Pub. No.: WO2005/009089

PCT Pub. Date: Jan. 27, 2005

(65) Prior Publication Data

US 2007/0095477 A1 May 3, 2007

(30) Foreign Application Priority Data

Jul. 23, 2003 (JP) .............................. 2003-278076
May 20, 2004 (JP) .............................. 2004-149995

(51) Int. Cl.
*H01L 21/306* (2006.01)
*C23C 16/458* (2006.01)

(52) U.S. Cl. .............................. 156/345.51; 156/345.3; 118/728

(58) Field of Classification Search ................ 118/728; 156/345.3, 345.51; 361/234
See application file for complete search history.

(56) References Cited

U.S. PATENT DOCUMENTS

| 5,099,571 | A | * | 3/1992 | Logan et al. ................... 29/825 |
| 5,589,003 | A | * | 12/1996 | Zhao et al. ................... 118/728 |
| 5,625,526 | A | * | 4/1997 | Watanabe et al. ........... 361/234 |
| 5,670,066 | A | * | 9/1997 | Barnes et al. .......... 219/121.58 |
| 5,708,250 | A | * | 1/1998 | Benjamin et al. ...... 219/121.58 |
| 6,164,633 | A | * | 12/2000 | Mulligan et al. .............. 269/21 |

(Continued)

FOREIGN PATENT DOCUMENTS

EP    1 132 948 A2    9/2001

(Continued)

OTHER PUBLICATIONS

Japanese Office Action Dated Jun. 26, 2007.

*Primary Examiner*—Jeffrie R Lund
(74) *Attorney, Agent, or Firm*—Pearne & Gordon LLP

(57) ABSTRACT

For a plasma processing apparatus that performs an etching process for the face of a wafer opposite the circuit formation face, ceramic insulating films having a ring shape are positioned on the mounting face of an electrode member in consonance with the location of a large wafer or a small wafer. When a large wafer is employed, a ring member is attached. And when a small wafer is employed, a blocking member is mounted to hide a gap between the insulating films deposited on the mounting face 3*b* and to cover suction holes. Further, a cover member is attached to cover the blocking member from the top. With this arrangement, the plasma process can be performed, using the same electrode member, for wafers having different sizes.

13 Claims, 19 Drawing Sheets

U.S. PATENT DOCUMENTS

| | | |
|---|---|---|
| 6,583,979 B1 | 6/2003 | Takahasi et al. |
| 6,815,646 B2 * | 11/2004 | Ito et al. .................. 219/444.1 |
| 7,056,831 B2 * | 6/2006 | Iwai et al. ................... 438/715 |
| 2001/0019472 A1 * | 9/2001 | Kanno et al. ................ 361/234 |
| 2002/0179246 A1 * | 12/2002 | Garabedian et al. ...... 156/345.3 |
| 2003/0037882 A1 | 2/2003 | Arita et al. |
| 2003/0198005 A1 * | 10/2003 | Sago et al. .................. 361/234 |
| 2004/0050496 A1 * | 3/2004 | Iwai et al. .............. 156/345.51 |
| 2007/0095477 A1 * | 5/2007 | Arita et al. ............. 156/345.47 |
| 2007/0223173 A1 * | 9/2007 | Fujisawa et al. ............ 361/234 |
| 2009/0165954 A1 * | 7/2009 | Kuthi et al. ............ 156/345.43 |

FOREIGN PATENT DOCUMENTS

| | | |
|---|---|---|
| EP | 1 215 716 A1 | 6/2002 |
| JP | 05-259048 | 10/1993 |
| JP | 09-102535 | 4/1997 |
| JP | 09-148219 | 6/1997 |
| JP | 10-223725 | 8/1998 |
| JP | 2001-77184 | 3/2001 |
| JP | 2001-210622 | 8/2001 |

\* cited by examiner

PLASMA PROCESSING APPARATUS

TECHNICAL FIELD

The present invention relates to a plasma processing apparatus that performs a plasma process for a wafer.

BACKGROUND ART

Since the thicknesses of semiconductor devices tend to be reduced, during a procedure employed in the manufacture of wafers for these devices, a thickness reduction process is performed to reduce the thicknesses of substrates. As part of this thickness reduction process, a circuit pattern is formed on one surface of a silicon substrate and the opposite face is mechanically ground. Following the grinding, a plasma process is used to remove a damaged layer, using etching, from the face of the silicon substrate for which the machine grinding was performed.

Since wafers come in a variety of sizes, it is desirable that a single plasma processing apparatus for performing such a wafer plasma process be capable of handling wafers having different sizes. Consequently, presently well known plasma processing apparatuses were developed for which part or all of an electrode whereon a wafer is positioned can be replaced, depending on the size of the wafer that is to be processed (see, for example, patent documents 1 and 2). According to the example in patent document 1, an electrode is composed of a plurality of layers, and only the topmost layer, on which a wafer to be processed is positioned, is replaced. According to the example in patent document 2, an entire electrode member, through which cooling water channels are formed, is replaced.

[Patent Document 1] JP-A-10-223725
[Patent Document 2] JP-A-2001-210622

However, the plasma processing apparatuses disclosed in these conventional examples have the following problems. First, during the plasma process, an electrode must be appropriately cooled in order to prevent an excessive rise in the temperature of the electrode or of a wafer that is heated by plasma. However, since according to the example in patent document 1 an electrode is divided into layers, thermal conduction is blocked at the joint where the portion of an electrode that is replaced contacts the portion that is not replaced, and a reduction in the cooling efficiency is unavoidable.

According to the example in patent document 2, since an expensive electrode member must be fabricated that corresponds in size to a wafer, costs is increased. In addition, since the space available for the removal and mounting of electrode members is limited, the work efficiency for the replacement of an electrode is low; excessive labor and time are required. Furthermore, during a replacement operation, cooling water retained in an electrode tends to leak into a processing chamber, which is a frequent cause of contamination. As is described above, conventionally, it is difficult to easily and inexpensively process a plurality of wafers having different sizes using a single plasma processing apparatus.

DISCLOSURE OF INVENTION

It is, therefore, one object of the present invention to provide a plasma processing apparatus, a single unit, that can easily and inexpensively process a plurality of wafers having different sizes.

To achieve this object, a plasma processing apparatus according to the present invention, which performs a plasma process for the reverse face of a wafer for which an insulating sheet is adhered to the obverse face and which, for the plasma process, can handle at least two wafers, a large wafer and a small wafer, comprises: an integrally formed electrode member, which is located in a process chamber that defines a closed space and which has a mounting face larger than a large wafer so that a wafer can be mounted while the insulating sheet is contacting the mounting face; a pressure reduction unit, for discharging a gas from the closed space to reduce pressure; a gas supply unit, for supplying a plasma generation gas to the closed space in which the pressure has been reduced; an opposing electrode, positioned opposite the electrode member; a plasma generator, for applying a high frequency voltage between the electrode member and the opposing electrode to set the plasma generation gas into a plasma state; a DC voltage application unit, for applying a DC voltage to the electrode member to electrostatically attract the wafer positioned on the mounting face; and a cooling unit for cooling the electrode member, wherein the mounting face of the electrode member is divided into a first area, which is located in the center of the mounting face, wherein a metal, the material used for the electrode member, is exposed, a first insulating area, the surface of which is covered with an insulating film, that encloses, like a ring, the outer edge of the first area, a second area, wherein the metal is exposed, that is extended, like a ring, around the outer edge of the first insulating area, and a second insulating area, the surface of which is covered with an insulating film, that encloses, like a ring, the outer edge of the second area, wherein a boundary between the first area and the first insulating area is designated inside the outer edge of a small wafer positioned in the center of the mounting face, and a boundary between the first insulating area and the second area is designated outside the outer edge of the small wafer, wherein a boundary between the second area and the second insulating area is designated inside the outer edge of a large wafer positioned in the center of the mounting face, and the second insulating area extends outward from the large wafer, and wherein a cover member, which has a ring shape and which is detachable from the mounting face, is provided to completely cover the second area.

Furthermore, a plasma processing apparatus according to the present invention, which performs a plasma process for the reverse face of a wafer for which an insulating sheet is adhered to the obverse face and which, for the plasma process, can handle at least two wafers, a large wafer and a small wafer, comprises: an integrally formed electrode member, which is located in a process chamber that defines a closed space and which has a mounting face larger than a large wafer so that a wafer can be mounted while the insulating sheet is contacting the mounting face; a pressure reduction unit, for discharging a gas from the closed space to reduce pressure; a gas supply unit, for supplying a plasma generation gas to the closed space in which the pressure has been reduced; an opposing electrode, positioned opposite the electrode member; a plasma generator, for applying a high frequency voltage between the electrode member and the opposing electrode to set the plasma generation gas into a plasma state; a DC voltage application unit, for applying a DC voltage to the electrode member to electrostatically attract the wafer positioned on the mounting face; and a cooling unit for cooling the electrode member, wherein the mounting face of the electrode member is divided into a first area, which is located in the center of the mounting face, wherein a metal, the material used for the electrode member, is exposed, a first insulating area, the surface of which is covered with an insulating film, that encloses, like a ring, the outer edge of the first area, a second area, wherein the metal is exposed, that is extended, like a ring, around the outer edge of the first insulating area, and a second. insulating area, the surface of which is covered with an insulating film, that encloses, like a ring, the outer edge of the second area, wherein a boundary between the first area and the first insulating area is designated inside the outer edge of a small wafer positioned in the center of the mounting face, and a boundary between the first insulating area and the second area is designated outside the outer edge of the small wafer, wherein a boundary between the second area and the second insulating area is designated inside the outer edge of a large wafer positioned in the center of the mounting face, and the second insulating area extends outward from the large wafer, and the second insulating area is located outside the outer edge of the large wafer, wherein a plurality of suction holes are formed in the first and the second areas and a vacuum suction unit is provided to create a vacuum and produce suction that, through the suction holes, draws the wafer to and holds the wafer on the mounting face, and wherein a cover member, which has a ring shape and which is detachable from the mounting face, is closely adhered across the entire face of the second area to completely cover all the suction holes formed in the second area.

According to the present invention, the mounting face of the electrode member on which a wafer to be processed is positioned is divided into: the first area, which is formed like a circle, concentric with the electrode member, and in which metal, the material used for the electrode member, is exposed; the first insulating area, the surface of which is covered with an insulating film, that encloses the outside of the first area like a ring; the second area, which extends, like a ring, outward from the first insulating film and in which the metal is exposed; the second insulating area, the surface of which is covered with an insulating film, that encloses, like a ring, the outside of the second area. Since the first and second insulating areas are arranged in accordance with the locations of the outer edges of a small wafer and a large wafer, the same plasma processing apparatus can easily and inexpensively process a plurality of wafers having different sizes.

BEST MODE FOR CARRYING OUT THE INVENTION

First Embodiment

First, the configuration of the plasma processing apparatus will be described while referring to FIGS. 1 and 2. The plasma processing apparatus performs a plasma process for the reverse face of a wafer whereon an insulating sheet is adhered to the obverse face. In this embodiment, a plurality of wafers including at the least a large wafer and a small wafer are to be processed.

Figure 1:
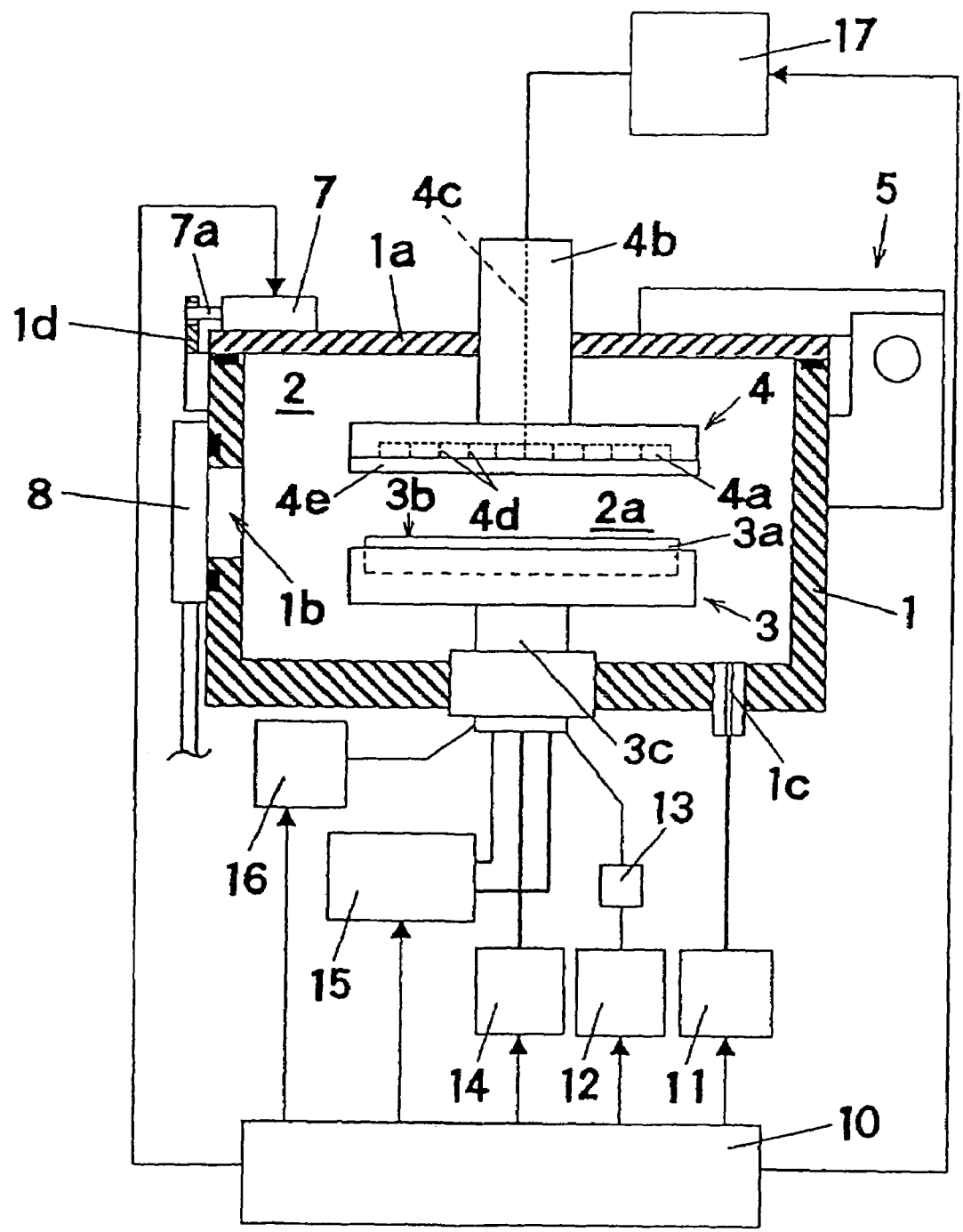
FIG. 1 is a side cross-sectional view of a plasma processing apparatus according to a first embodiment of the present invention.

In FIG. 1, a vacuum chamber 1 is a container with a lid member 1a that can be opened and closed by a hinge mechanism 5 (see FIG. 2) at the top. A lock cylinder 7 is located at the end of the upper face of the lid member 1a, and when the lid member 1a is closed, a rod 7a is fitted into an engagement portion 1d that is fixed to the side face of the vacuum chamber 1, so that the lid member 1a is locked and provides a closed space.

By closing the lid member 1a, the closed space is defined in the vacuum chamber 1 and is used as a process chamber 2 wherein plasma is generated under reduced pressure to perform a plasma process. An opening 1b, fitted with a door member 8, is arranged on the side face of the vacuum chamber 1. The opening 1b is exposed or blocked by raising or lowering the door member 8, and when exposed, a process object can be inserted into or removed from the process chamber 2. Further, as is shown in FIG. 2, when the lid member 1a is pivoted upward by the hinge mechanism 5, the process chamber 2 is open from above, so that, as is described later, the replacement of a stage, when a wafer having a different size is employed, and internal maintenance can be easily performed.

In the process chamber 2, a first electrode 3 and a second electrode 4 are vertically arranged, facing each other, so that the second electrode 4, relative to the first electrode 3, is an opposed electrode. The first electrode 3 and the second electrode 4 are cylindrically shaped, and are concentrically positioned in the process chamber 2. The first electrode 3 is made of a conductive metal, such as aluminum, and is so designed that a support portion 3c extends downward from a disk-shaped main body, to which an electrode portion (electrode member) 3a is attached. The support portion 3c is held in the vacuum chamber 1 by an insulating member, so that in the vacuum chamber 1, the support portion 3c is electrically insulated. A wafer 6 to be processed (see either wafer 6A or 6B in FIG. 5) is positioned on the electrode portion 3a.

The second electrode 4, as well as the first electrode 3, is made of a conductive metal, such as aluminum, and has a support portion 4b that extends upward from a disk-shaped electrode portion 4a. The support portion 4b is so held that it is electrically conductive in the vacuum chamber 1, and when the lid member 1a is closed, a discharge space 2a for plasma generation is defined between an electrode portion 4a and the electrode portion 3a of the first electrode 3 located below.

A vacuum pumping unit 11 is connected to an air release port 1c that communicates with the process chamber 2. When the vacuum pumping unit 11 is driven, air inside the process chamber 2 of the vacuum chamber 1 is evacuated, and the pressure in the process chamber 2 is reduced. The vacuum pumping unit 11 serves as pressure reduction means for evacuating gas, through the air release port 1c, from the process chamber 2, a closed space, and for reducing the pressure therein.

The first electrode 3 is electrically connected to a high frequency power source 16. Thus, when the high frequency power source 16 is driven, a high frequency voltage is applied between the second electrode 4 and the first electrode 3, which are conductive in the vacuum chamber 1 that is grounded. As a result, a plasma discharge occurs in the process chamber 2. The high frequency power source 16 serves as plasma generation means for applying a high frequency voltage between the first electrode 3 and the second electrode 4, and for changing a plasma generation gas to the plasma state.

Further, a DC power source (direct-current power source) 12 for electrostatic attraction is connected to the first electrode 3 through an RF filter 13. When the DC power source 12 for electrostatic attraction is driven, a negative charge is accumulated on the surface of the first electrode 3. In this state, when the high frequency power source 16 is driven to generate plasma in the process chamber 2, a positive charge is accumulated on a wafer 6.

Then, Coulomb forces, acting between the negative charge accumulated on the first electrode 3 and the positive charge accumulated on the wafer 6, hold the wafer 6 to the first electrode 3 through an insulating sheet 6a, which is a dielectric member. At this time, the RF filter 13 prevents the high frequency power source 16 from applying a high frequency voltage directly to the DC power source 12 for electrostatic attraction. The DC power source 12 for electrostatic attraction serves as DC voltage application means for applying a DC voltage to the electrode member 3a of the first electrode 3 to electrostatically attract a wafer 6 positioned on a mounting face 3b.

The detailed structure of the second electrode 4 will now be described. Gas propulsion holes 4d are formed in the center of the lower face of the second electrode 4. The gas propulsion holes 4d communicate with a gas supply unit 17 through a gas supply hole 4c formed inside the support portion 4b. Since the gas propulsion holes 4d are covered with a porous plate 4e, a gas propelled through the gas propulsion holes 4d spreads through the porous plate 4e. When the gas supply unit 17 is driven, a plasma generation gas containing fluorine is passed through the gas propulsion holes 4d and the porous plate 4e and is supplied to the discharge space 2a. The gas supply unit 17 serves as gas supply means for supplying a plasma generation gas to the process chamber 2 wherein the pressure has been reduced.

In the configuration shown in FIG. 1, the lock cylinder 7, the vacuum pumping unit 11, the DC power source 12 for electrostatic attraction, a vacuum pump 14, a cooling mechanism 15, the high frequency power source 16, and the gas supply unit 17 are controlled by a controller 10, and the plasma process is performed while control of these individual sections is exercised by the controller 10.

An explanation will now be given for a wafer 6 to be processed by the plasma processing apparatus. The wafer 6 is a semiconductor substrate, and a logic circuit is formed on its obverse surface. The face opposite the circuit formation face is ground by a machine, and thereafter, a plasma process, using etching, is performed for this reverse face of the semiconductor substrate to remove micro-cracks that are caused by the machining.

The insulating sheet 6a is adhered to the circuit formation portion of the obverse face (the lower side in FIGS. 5, 7 and 9) of the wafer 6. And during the plasma process, the insulating sheet 6a is brought into contact with the mounting face 3b, which is the upper face of the first electrode 3, so that the wafer 6 is positioned with the mechanically ground face facing upward. The insulating sheet 6a, a resin sheet whereon a film, about 100 μm thick, composed of an insulating resin such as polyolefin, polyimide or poly(ethylene terephthalate) has been deposited, is adhered to the circuit formation face of the wafer 6 using a pressure sensitive adhesive. The insulating sheet 6a adhered to the wafer 6 protects the circuit formation face of the wafer 6, and also functions as a dielectric member for the electrostatical attraction the wafer 6, as will be described later.

As is described above, the plasma processing apparatus of this embodiment processes wafers 6A and 6B having a plurality of sizes (in this embodiment, two sizes are processed: large (12 inches) and small (8 inches)), and performs the plasma process for either of these wafers that has been positioned on the common electrode member 3a. Therefore, the mounting face 3b, which is the upper face of the electrode member 3a, is larger than a large wafer 6A so that, of the plurality of wafers, a large wafer 6A can be positioned. To process a small wafer 6B, a separately provided cover member is used to cover the portion of the mounting face 3b that is exposed, so that the exposed portion will not be damaged by plasma during the process performed for the smaller wafer.

Figure 3:
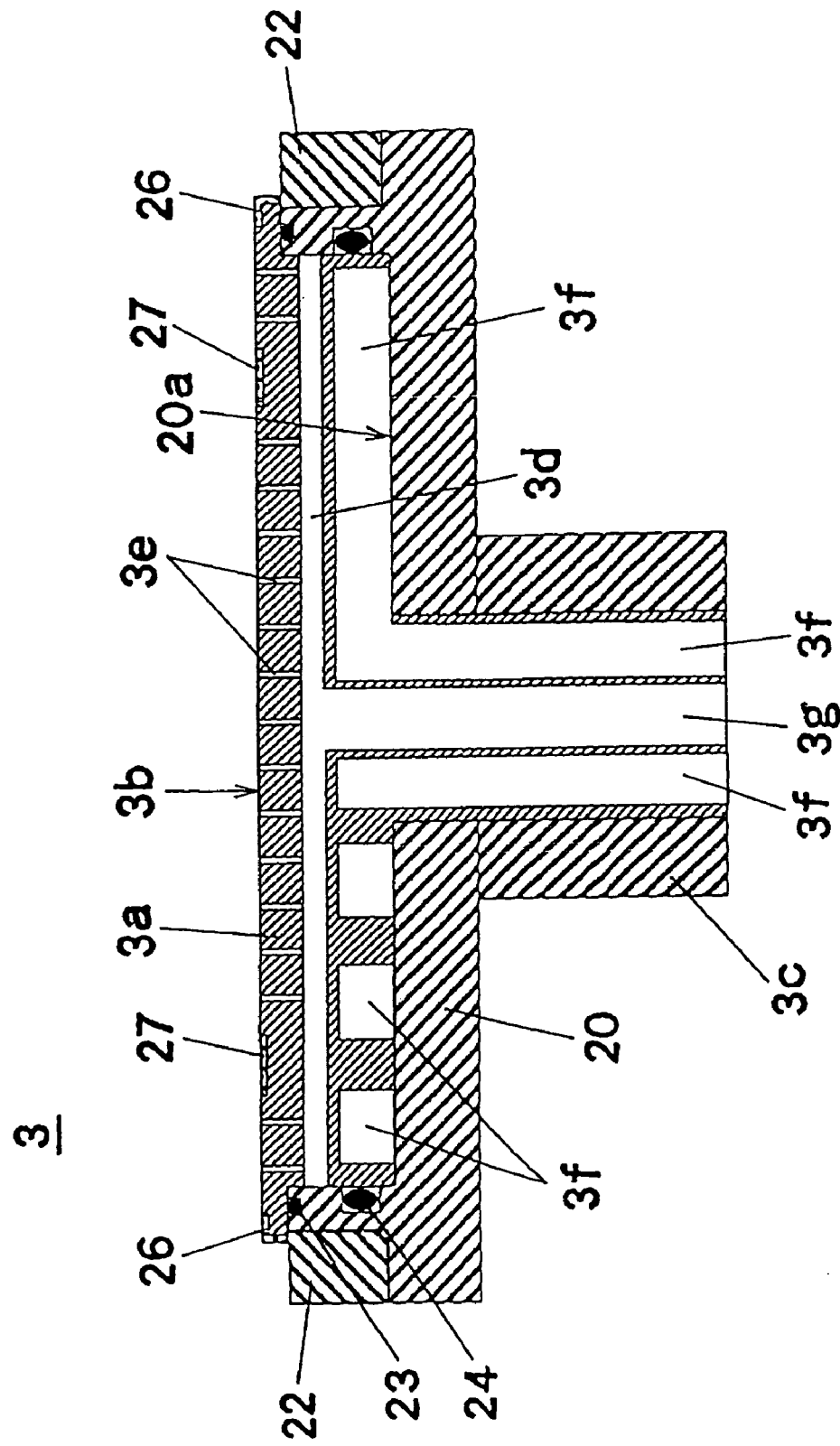
FIG. 3 is a cross-sectional view of the electrode member of the plasma processing apparatus according to the first embodiment.
Figure 4:
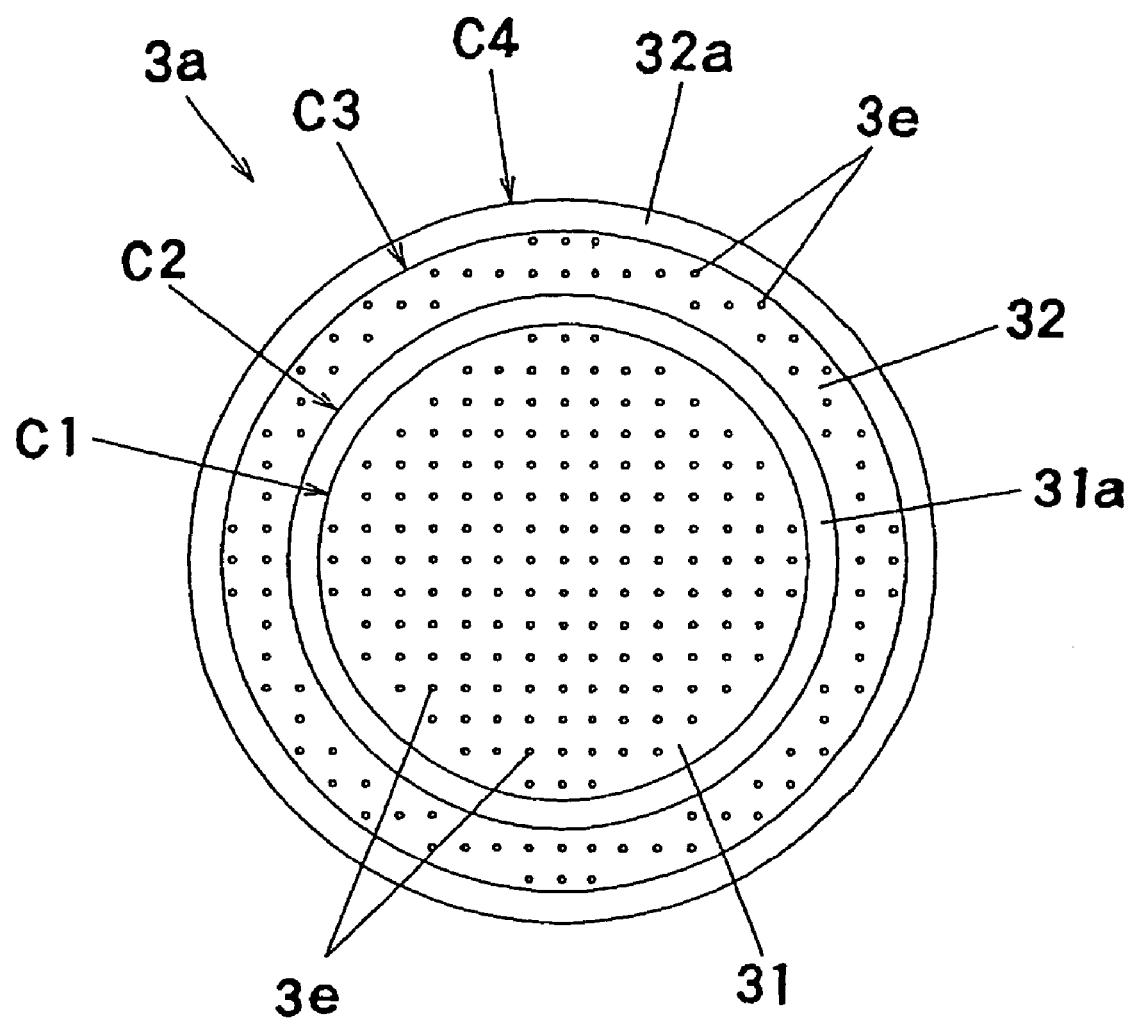
FIG. 4 is a plan view of the electrode member of the plasma processing apparatus according to the first embodiment.

While referring to FIGS. 3, 4 and 5, an explanation will now be given for the detailed structure of the first electrode 3 to which is attached the electrode member 3a, which can be used in common for the two sizes represented by wafers 6A and 6B, as is described above. A cross section of the first electrode 3 is shown in FIG. 3. For the first electrode 3, a circular recessed portion 20a is formed in the upper face of a base 20 that is shaped substantially like a disk, and the electrode member 3a is integrally formed and fitted into the recessed portion 20a, while an outer ring member 22 is fitted around the outer edge of the base 20.

Multiple suction holes 3e, formed in the upper face of the electrode portion 3a, open upward, toward the mounting face 3b. The suction holes 3e communicate through an internal hole 3d, which is formed horizontally inside the electrode member 3a, with a suction hole 3g that opens downward, toward the lower end of the support portion 3c. As is shown in FIG. 1, the suction hole 3g communicates with the vacuum pump 14, and when the vacuum pump 14 is driven, a vacuum is created and suction is produced that, through the suction holes 3e, draws down a wafer 6, positioned on the mounting face 3b, and holds it against the mounting face 3b. The vacuum pump 14 is vacuum creation means for producing suction that, through the suction holes 3e, draws down and holds a wafer 6 on the mounting face 3b. A sealing member 23 is provided at the face whereat the electrode member 3a and the base 20 contact each other, so that while the vacuum produced suction is applied, an airtight seal is ensured.

A plurality of circumferential grooves and a plurality of diametrical grooves are formed in the lower face of the electrode portion 3a. When the electrode member 3a is assembled in the recessed portion 20a, these grooves serve as coolant flow paths 3f for cooling the electrode member 3a. The ends of the coolant flow paths 3f open towards the lower end of the support portion 3c, and as is shown in FIG. 1, are connected to the cooling mechanism 15. When the cooling mechanism 15 is driven, a coolant such as cooling water circulates along the coolant flow paths 3f, so that the electrode member 3a, the temperature of which is increased by heat generated during the plasma process, and the insulating sheet 6a of a wafer 6, which is positioned on the electrode member 3a, are cooled. The coolant flow paths 3f and the cooling mechanism 15 constitute cooling means for cooling the electrode member 3a. A sealing member 24 is attached to the face where the electrode member 3a and the base 20 contact each other, so that while the coolant is circulating, a watertight seal is ensured.

The mounting face 3b of the electrode member 3a will now be explained. The mounting face 3b of the electrode member 3a is divided into a plurality of segments along the concentric boundaries. Specifically, as is shown in FIG. 4, a first area 31, which is a circular segment, is concentrically arranged with the electrode member 3a in the center of the mounting face 3b. A conductive metal, the material that is used for the electrode member 3a, is exposed in the surface of the first area 31, in which suction holes 3e are formed. A first, ring-shaped insulating area 31a, which is covered with an insulating film 27 that is formed of aluminous ceramic (see FIGS. 3 and 5), encloses the outside edge of the first area 31.

Further, a second area 32, a ring-shaped segment, is located outside the first insulating area 31a. And just as in the first area 31, a conductive metal, the material that is used for the electrode 3a, is exposed in the surface of the second area 32, in which suction holes 3e are also formed. Furthermore, a second, ring-shaped insulating area 32a, which is covered with an insulating film 26 that is also formed of aluminous ceramic (see FIGS. 3 and 6), encloses the outside edge of the second area 32.

While referring to FIG. 5, an explanation will be given for the relationship existing between the insulating areas of the thus defined segments of the mounting face 3b, i.e., the portions of the mounting face 3b that are covered with the insulating films 26 and 27, and the sizes of the wafers 6. The insulating areas are provided to protect the metal, which is the conductive portion of the electrode member 3a, from direct exposure to plasma in the discharge area 2a. In FIG. 5 is shown the relationship between the positions of the insulating films 26 and 27 and the positions of the outer edges of large and small wafers 6A and 6B that are positioned in the center of the mounting face 3b.

When a large wafer 6A is to be positioned, a ring member 29 is attached to an outer ring member 22. The ring member 29 is used to introduce and guide a large wafer 6A and to prevent the positional shifting of the wafer 6A relative to the mounting face 3b. To position a small wafer 6B, a detachable cover member 25 is attached to the mounting face 3b. The cover member 25 is also used to introduce and guide a small wafer 6B and to prevent the positional shifting of the wafer 6B. The function of the cover member 25 will be described later.

First, the positional relationship between a wafer 6B and the first insulating area 31a will be explained. As is shown in FIG. 5, a boundary C1 (see FIG. 4), between the first area 31 and the first insulating area 31a, is located inside the outer edge of a wafer 6B that is positioned in the center of the mounting face 3b, and is completely hidden by the wafer 6B. A boundary C2 (see FIG. 4) between the first insulating area 31a and the second area 32 is located outside the outer edge of the wafer 6B, so that it is not hidden by the wafer 6B.

Furthermore, a boundary C3 (see FIG. 4) between the second area 32 and the second insulating area 32a is located inside the outer edge of a wafer 6A that is positioned in the center of the mounting face 3b, and is completely hidden by the wafer 6A. An outer edge boundary C4 (see FIG. 4) of the second insulating area 32a is located outside the outer edge of the wafer 6A, so that it is not hidden by the wafer 6A.

The cover member 25 will now be described. The cover member 25 (see FIG. 8) is made of ceramic and is shaped like a ring, so that when it is attached to the mounting face 3b, from above, it completely covers the second area 32 (the range extending from the boundary C2 to the boundary C3). The cover member 25 is provided for the mounting face 3b when a wafer 6B is to be processed, or is removed from the mounting face 3b when a wafer 6A is to be processed.

To attach the cover member 25 to the mounting face 3b, a ring-shaped blocking member 9 is placed on the second area 32 of the mounting face 3b. The blocking member 9 is a dummy wafer to which an insulating sheet 9a, which is made of the same material as the insulating sheet 6a adhered to wafers 6A and 6B, is adhered to one face (the lower face in FIG. 5) of a ring plate that is made of the same silicon as wafers 6A and 6B. The blocking member 9 may be a resin plate made, for example, of glass epoxy or poly(ethylene terephthalate).

Since the blocking member 9 is attached, during the vacuum suction process performed using the suction holes 3e, the blocking member 9 closely contacts the mounting face 3b and blocks the suction holes 3e formed in the second area 32. Therefore, vacuum produced suction is applied to a wafer 6B only through the suction holes 3e formed in the first area 31, which is the suction range required for a wafer 6B. Further, from above, the thus provided blocking member 9 is completely hidden by the cover member 25. Thus, the blocking member 9 can be protected from exposure to plasma, and wearing of the part can be prevented.

Figure 5:
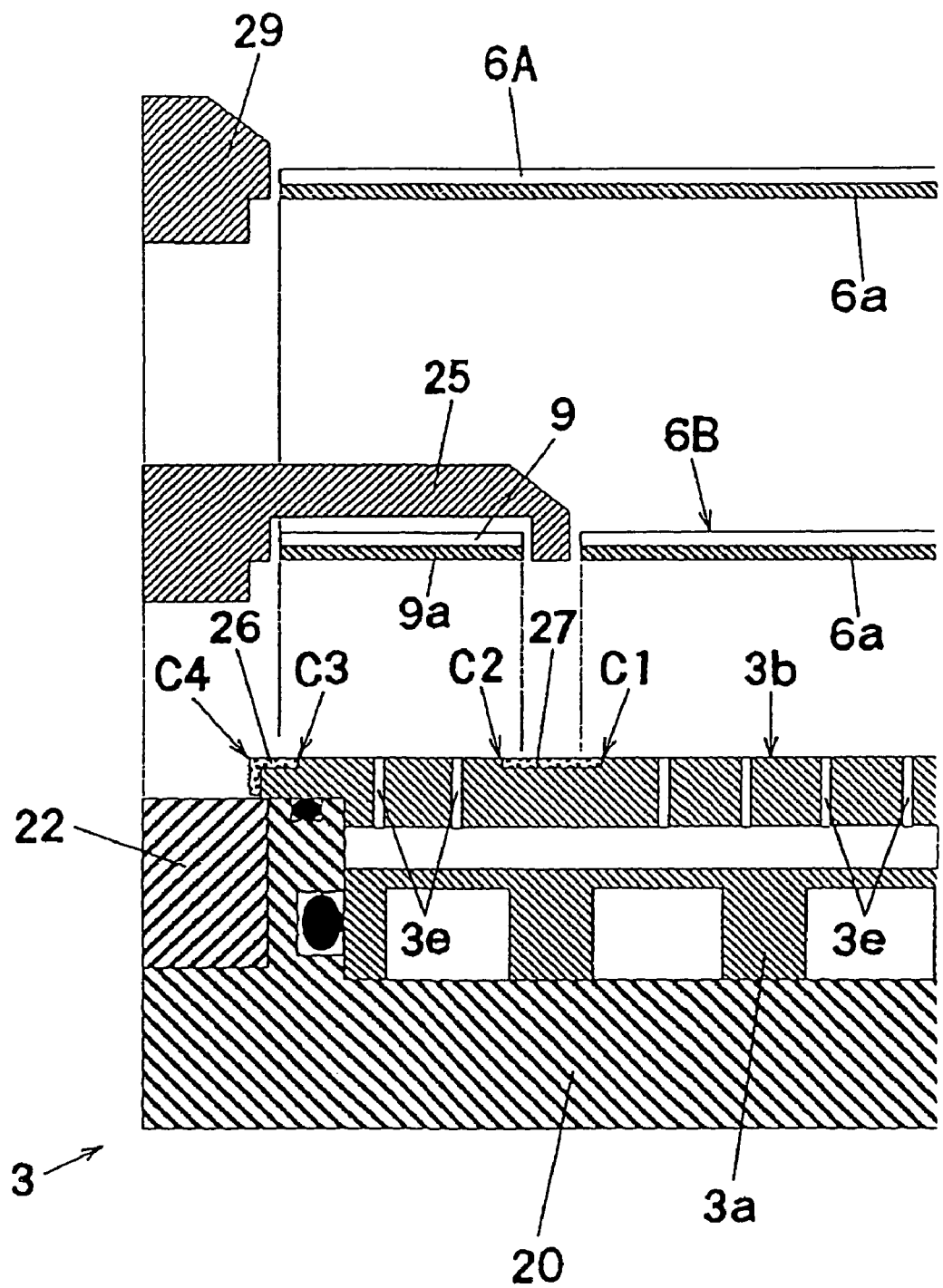
FIG. 5 is a cross-sectional view of part of the electrode member of the plasma processing apparatus according to the first embodiment.

In this embodiment, the outer diameter of the cover member 25 is equal to the outer diameter of the ring member 29 (see FIG. 5). However, the outer diameters of these members may differ. With this arrangement, a difference in the outer diameters can be detected by an optical sensor, and whether the cover member 25 is attached to the electrode member 3a can be automatically determined.

Figure 6:
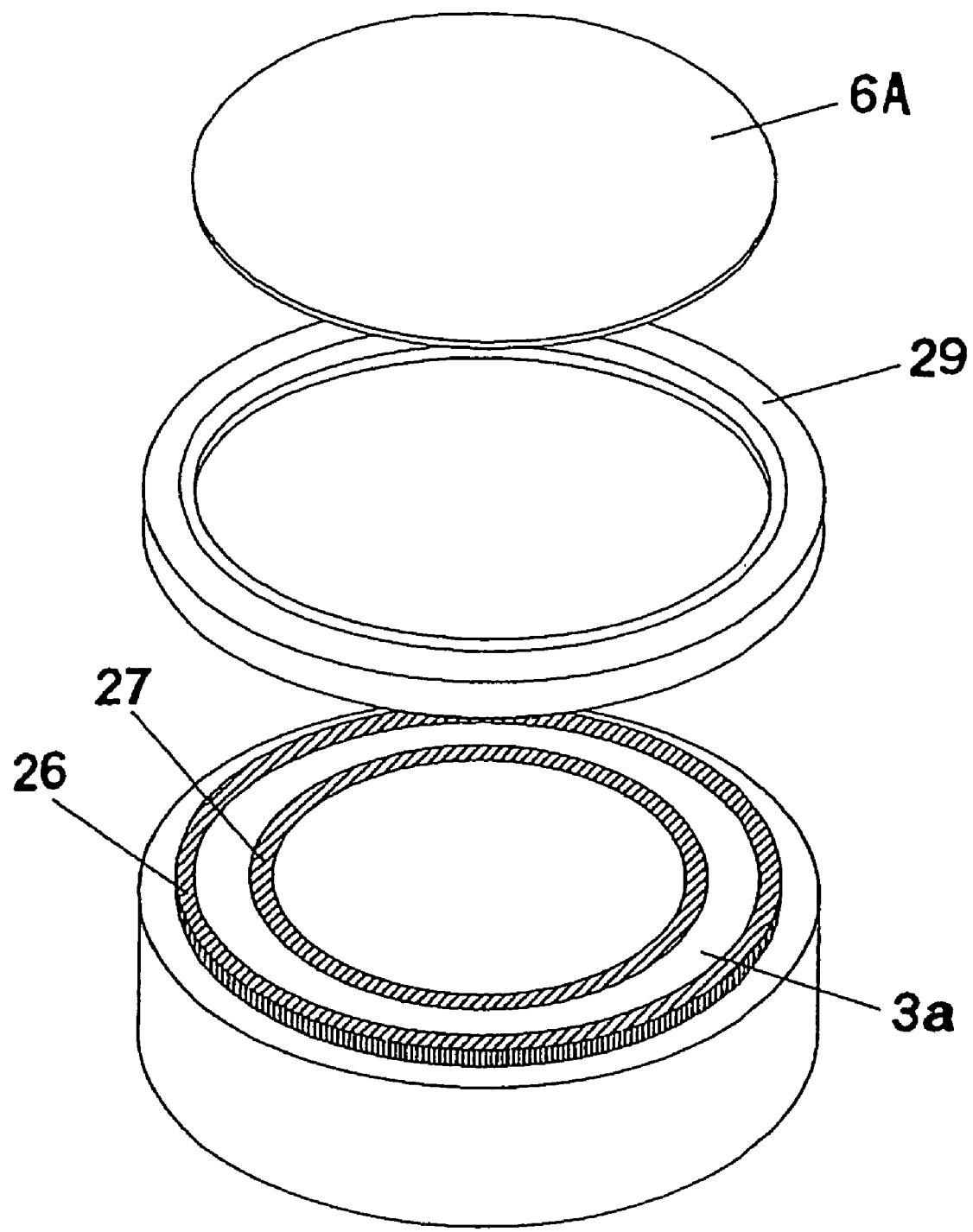
FIG. 6 is a perspective view of the electrode member of the plasma processing apparatus according to the first embodiment.
Figure 7:
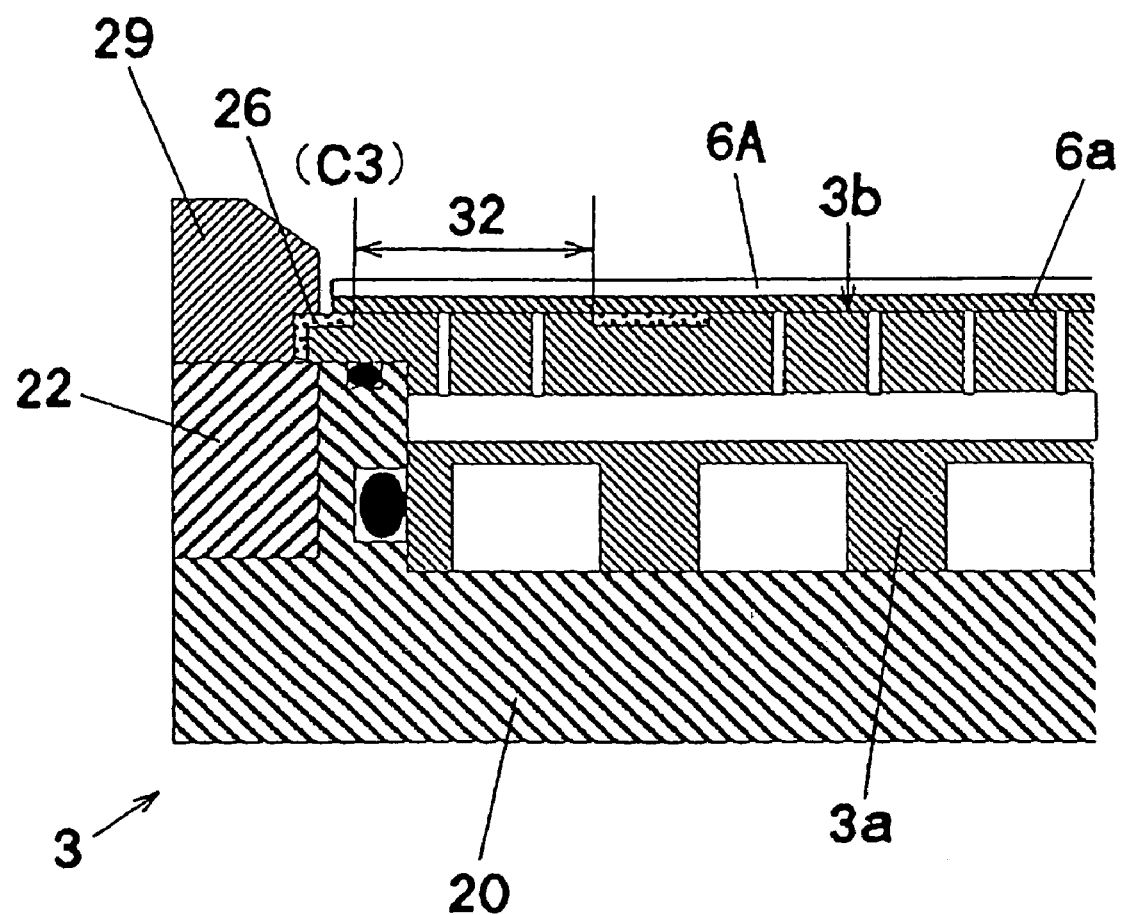
FIG. 7 is a cross-sectional view of part of the electrode member of the plasma processing apparatus according to the first embodiment.

The plasma process will now be described. When a wafer 6A is employed, as is shown in FIG. 6, in a preparation process, the ring member 29 is attached to the electrode member 3a. This process is performed while the process chamber 2 is open, as is shown in FIG. 2. After this process has been completed and the process chamber 2 has been closed, the plasma process is started, and a wafer 6A is attached to the electrode member 3a. In the state wherein the wafer 6A is positioned, as is shown in FIG. 7, the outer edge of the wafer 6A rests on the insulating film 26, and the boundary C3 between the insulating film and the second area 32 is completely hidden.

Figure 8:
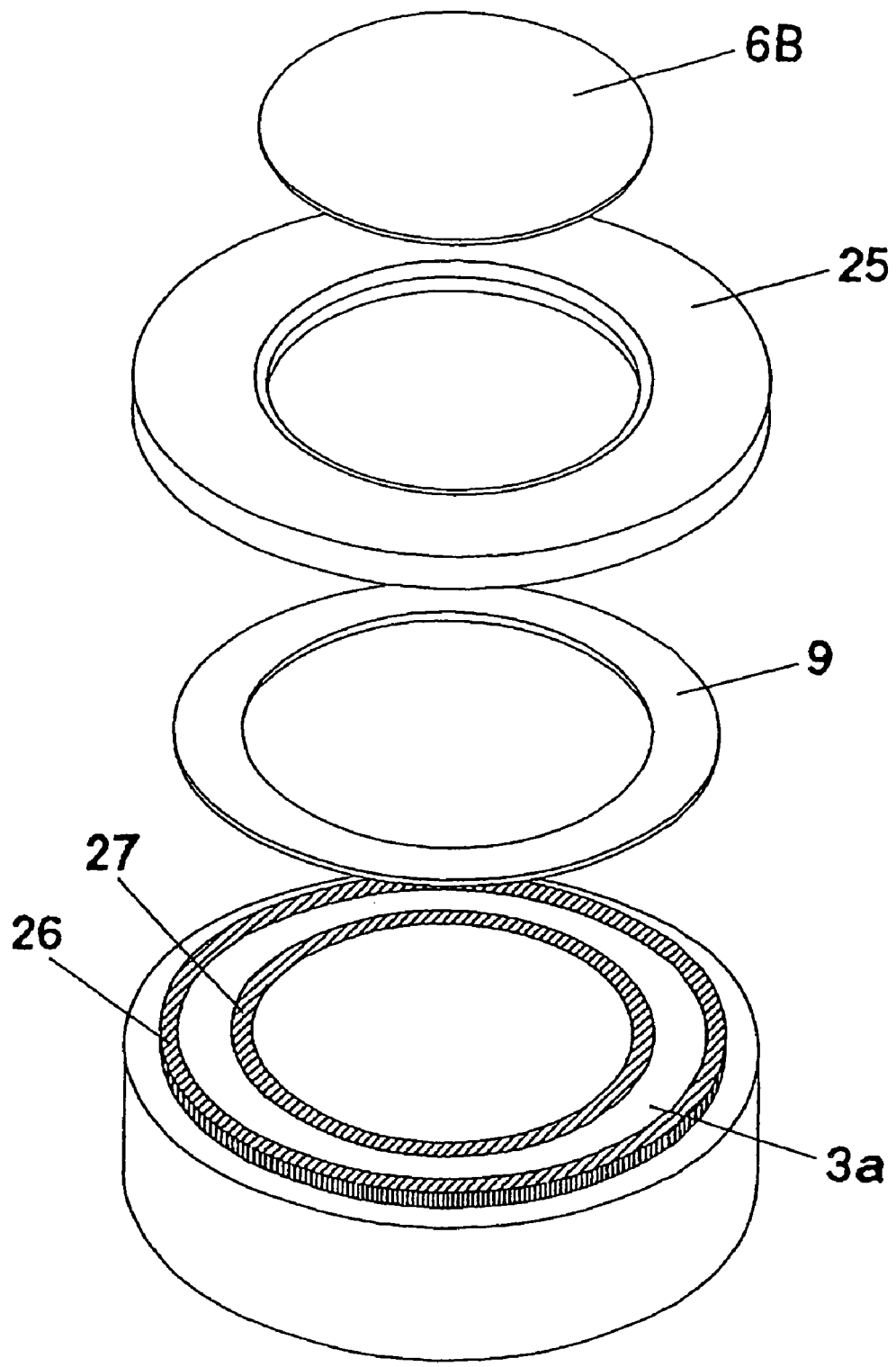
FIG. 8 is a perspective view of the electrode member of the plasma processing apparatus according to the first embodiment.
Figure 9:
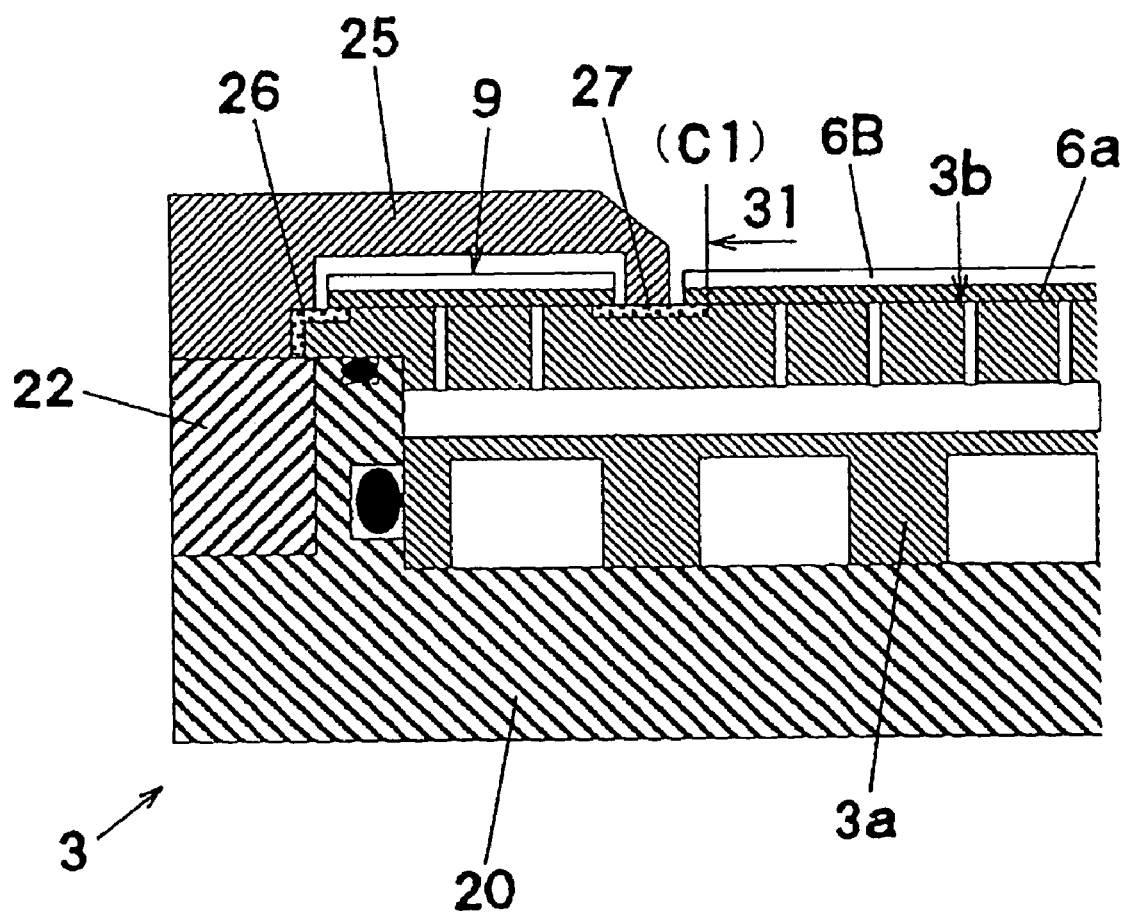
FIG. 9 is a cross-sectional view of part of the electrode member of the plasma processing apparatus according to the first embodiment.

When a wafer 6B is employed in the preparation process, as is shown in FIG. 8, the blocking member 9 is attached to the electrode member 3a and the cover member 25 is attached to cover the blocking member 9. When this process has been completed and the process chamber 2 has been closed, the plasma process is initiated, and the wafer 6B is attached to the electrode member 3a. In the state wherein the wafer 6B has been mounted, as is shown in FIG. 9, the outer edge of the wafer 6B rests on the insulating film 27, and the boundary C1 between the insulating film 27 and the first area 31 is completely hidden by the wafer 6B.

Figure 2:
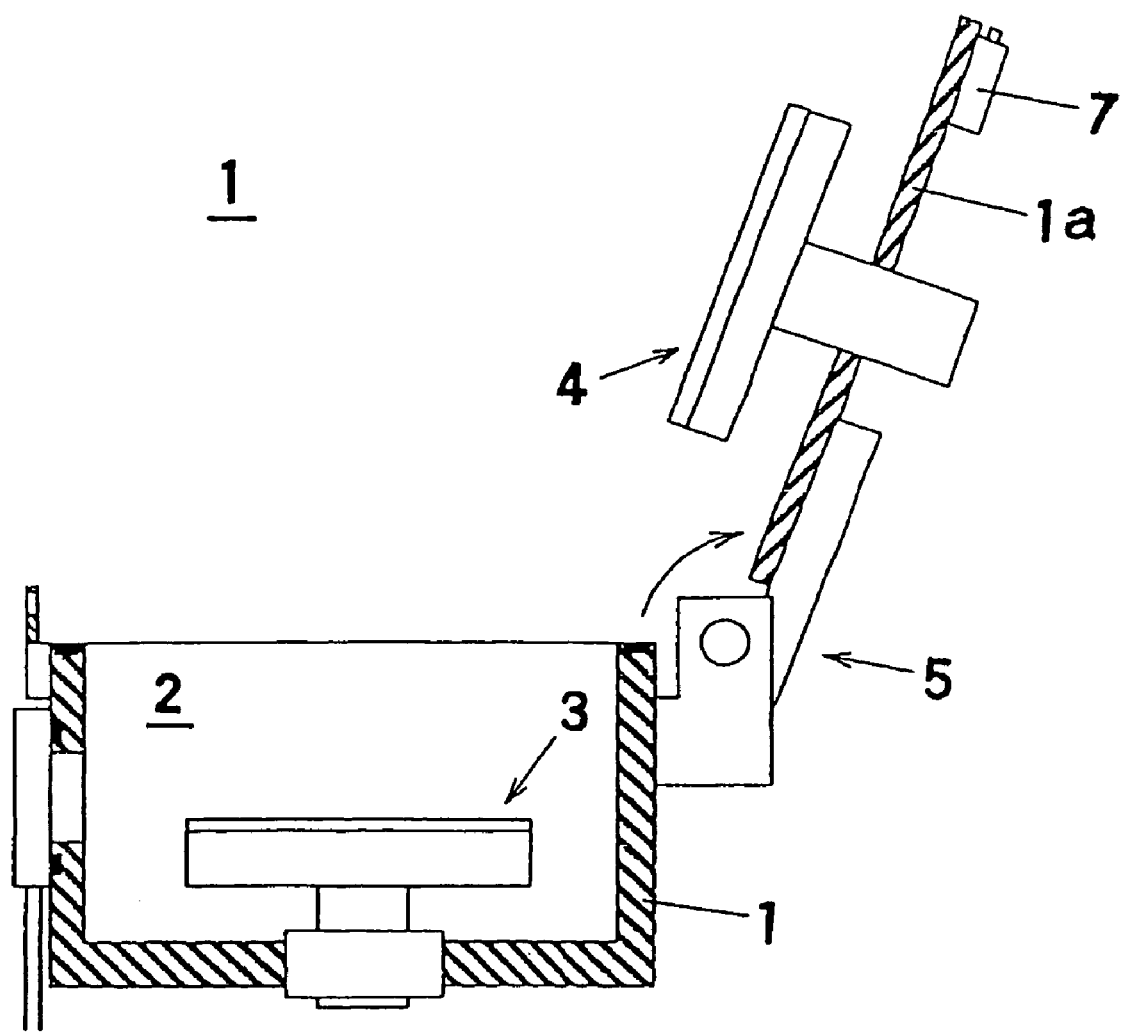
FIG. 2 is a side cross-sectional view of the vacuum chamber of the plasma processing apparatus according to the first embodiment.

During the stage replacement process performed when wafers are changed, as is shown in FIG. 2, the ring member 29 and the cover member 25 can be replaced efficiently while the process chamber 2 is open. Further, since the electrode member 3a is integrally formed, the stage replacement process can be performed while the coolant flow paths 3f for cooling an electrode member are completely closed, so that the inside of the process chamber 2 can be prevented from being damaged due to the leakage of coolant.

When either a wafer 6A or a wafer 6B has been positioned on the mounting face 3b, the process chamber 2 is closed and the plasma process is begun. During the plasma process, first, the vacuum pump 14 is driven, creating a vacuum and producing suction that, through the suction holes 3e and 3g, draws the wafer 6A or 6B down and holds it so that it closely contacts the mounting face 3b.

Then, the vacuum pumping unit 11 is driven to create a vacuum and evacuate air from the process chamber 2, and the gas supply unit 17 supplies a plasma generation gas to the process chamber 2. Thereafter, the DC power source 12 for electrostatic attraction is driven to apply a DC voltage, and the high frequency power source 16 is driven to start plasma discharge. Through this process, plasma is generated in the discharge space 2a to perform the plasma process for the wafer 6A or 6B. During this plasma process, an electrostatic attraction force is generated between the electrode member 3a and the wafer 6A or 6B, so that the wafer 6A or 6B is held to the electrode member 3a by the electrostatic attraction force.

During the electrostatic attraction process, the center of the insulating sheet 6 is brought into contact with the center of the electrode member 3a, and the outer edge of the insulating sheet 6a is brought into contact with the insulating film 26 or 27. Then, mainly the center portion of the insulating sheet 6a is employed as a dielectric member for the performance of the electrostatic attraction process, and the wafer 6A or 6B, at the center of the upper face, is electrostatically attracted while the outer edge of the insulating sheet 6a is brought into close contact with the insulating film 26 or 27. As a result, the conductive portion of the electrode member 3a is insulated from the plasma. And therefore, efficient electrostatic attraction can be obtained without the charge employed for electrostatic attraction leaking to the plasma side.

During the plasma process, regardless of which of the wafers 6A and 6B is employed, the first area 31 and the second area 32, which are the conductive portions forming the surface of the electrode member 3a, are completely insulated from plasma generated in the discharge space 2a. Therefore, an abnormal plasma discharge can be prevented, and the operating state of the plasma processing apparatus can be stabilized.

Second Embodiment

Figure 10:
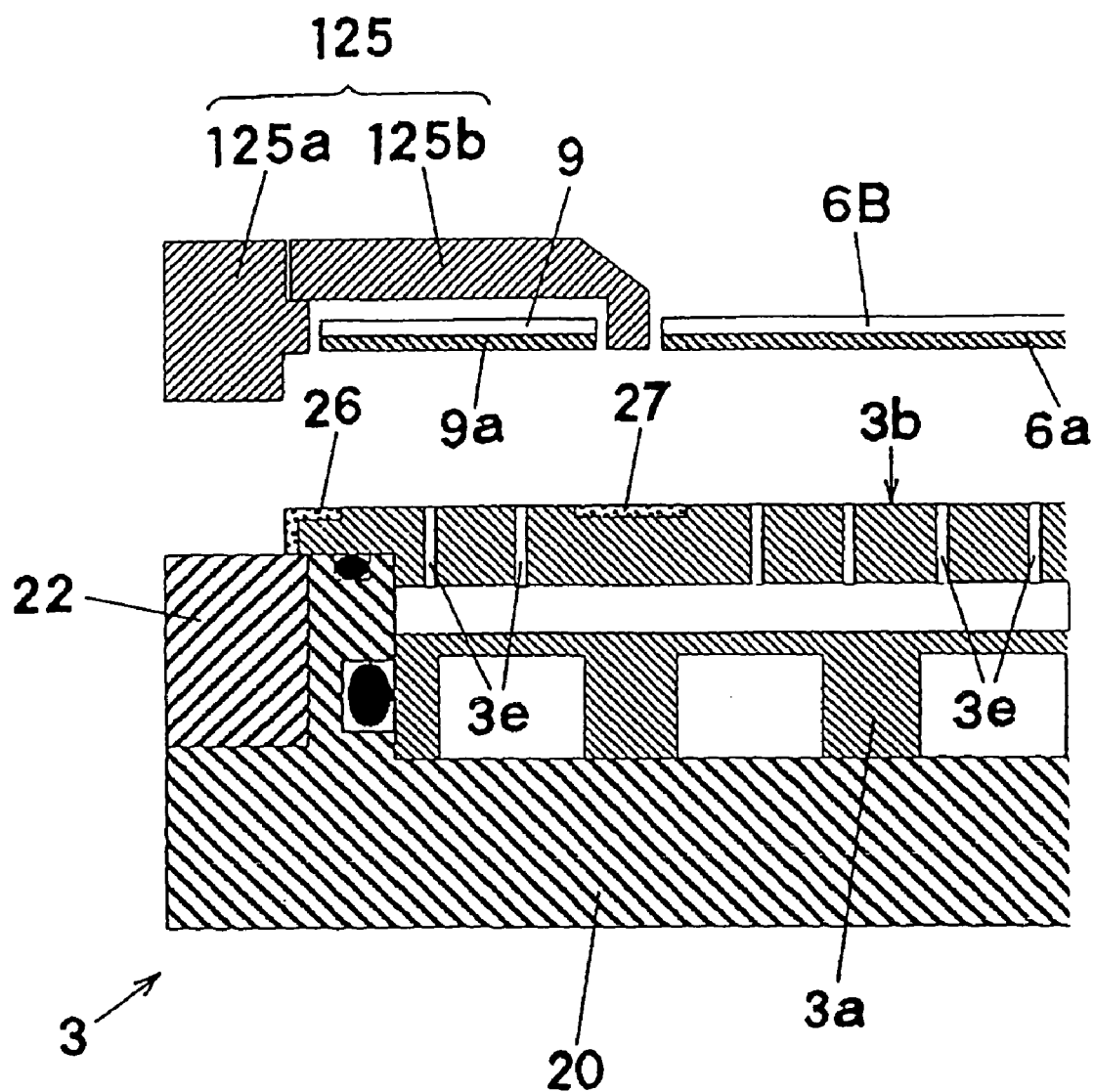
FIG. 10 is a cross-sectional view of part of the electrode member of a plasma processing apparatus according to a second embodiment of the present invention.
Figure 11:
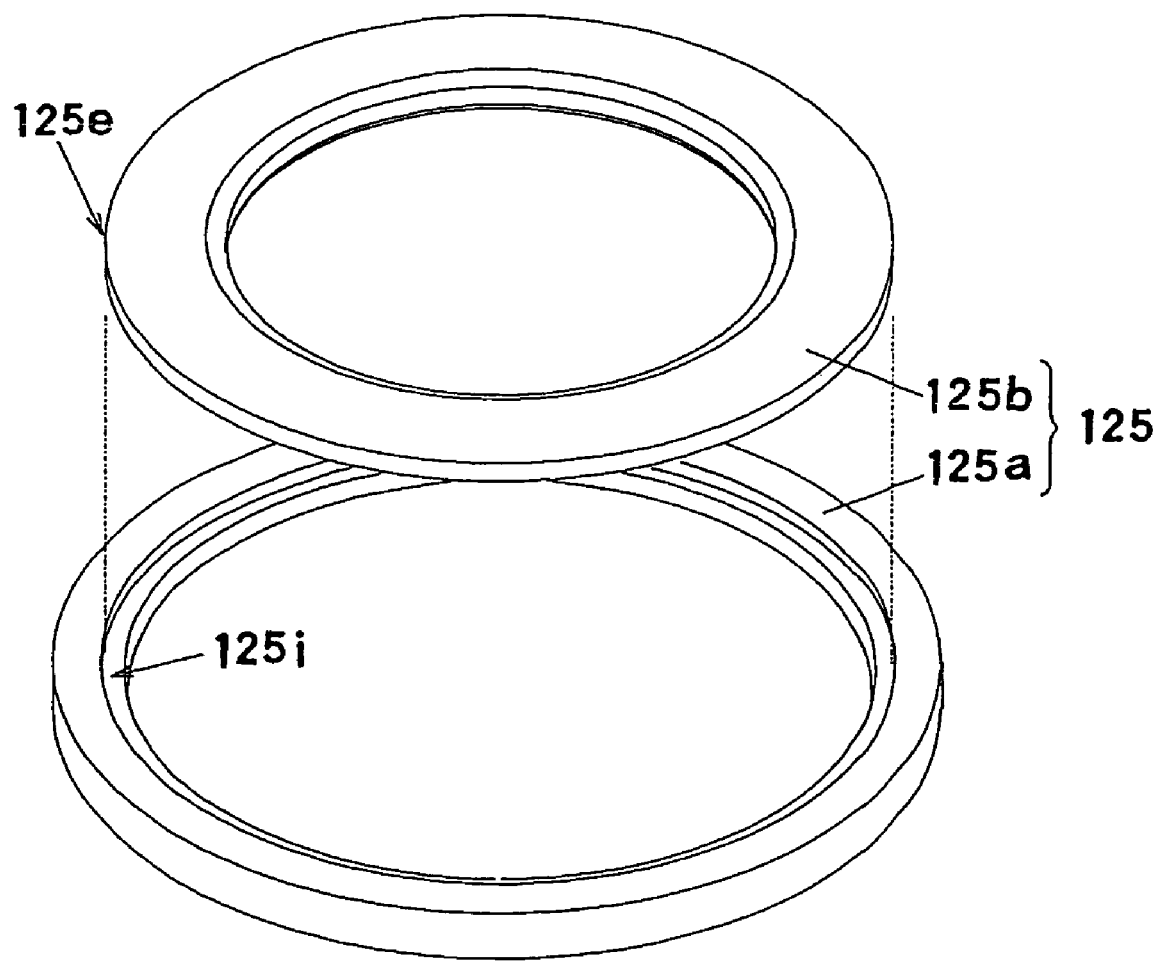
FIG. 11 is a perspective view of the cover member of the plasma processing apparatus according to the second embodiment.
Figure 12:
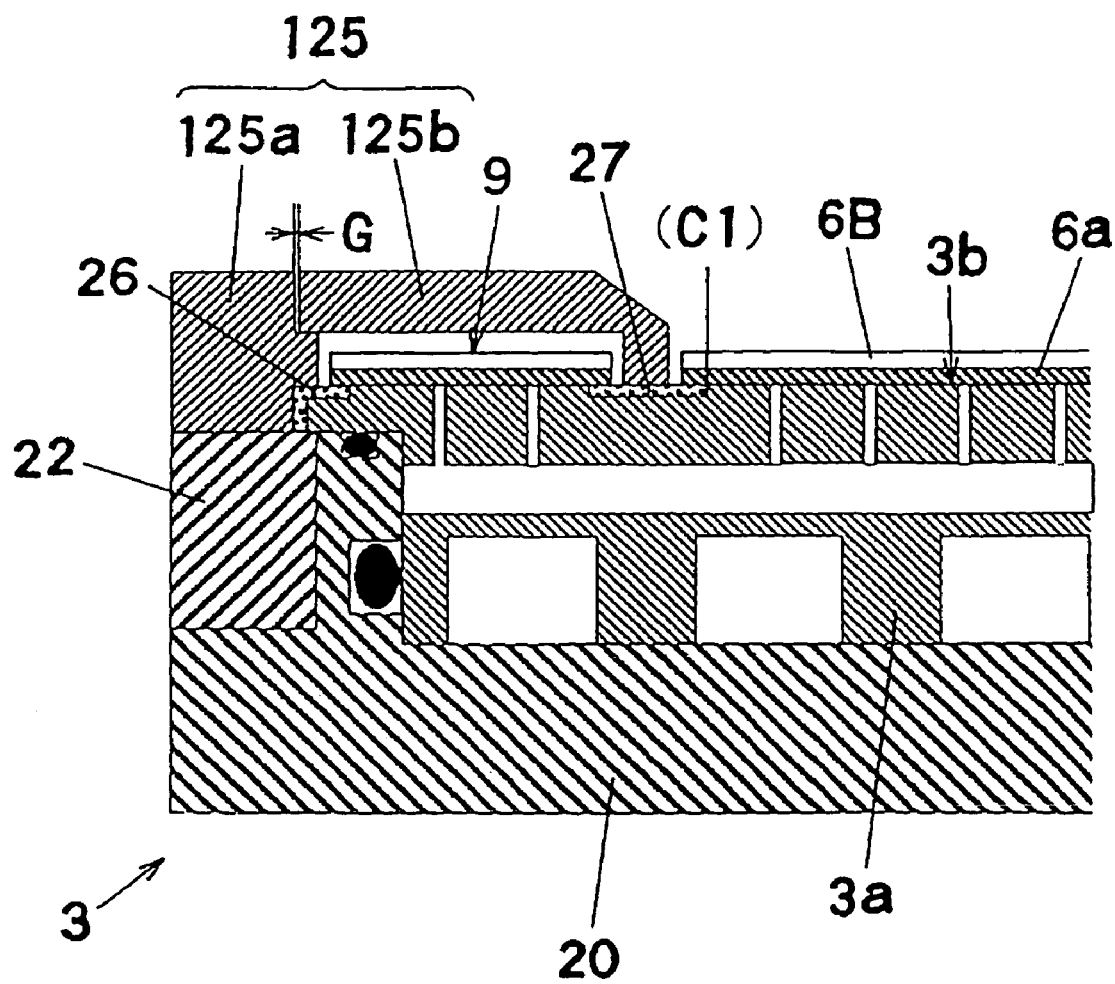
FIG. 12 is a cross-sectional view of part of the electrode member of the plasma processing apparatus according to the second embodiment.

FIGS. 10 and 12 are cross-sectional views of parts of the electrode member of a plasma processing apparatus according to a second embodiment of the invention, and FIG. 11 is a perspective view of the cover member of the plasma processing apparatus according to the second embodiment. For the second embodiment, the cover member 25 of the plasma processing apparatus in the first embodiment is divided into two rings, an inner and an outer.

In FIG. 10, a first electrode 3 has the same structure as the first electrode 3 shown in FIG. 5 for the first embodiment, i.e., an electrode member 3a is fitted into a base 20, and an outer ring member 22 is assembled with the outer edge of the base 20. As in the first embodiment, a mounting face 3b, which is the upper face of the electrode member 3a, is divided, by insulating films 26 and 27, into a first area 31, a second area 32, a first insulating area 31a and a second insulating area 32a (see FIG. 4).

Also in the second embodiment, when a wafer 6B is employed for the plasma process, the same blocking member 9 used for the first embodiment is placed on the mounting face 3b to completely hide the second area 32, and further, a cover member 125 having the same function as the cover member 25 in the first embodiment is provided to cover the blocking member 9. The cover member 125 used for the second embodiment is obtained by dividing the cover member 25 in the first embodiment into two ring members, i.e., an outer ring 125a and an inner ring 125b. The outer ring 125a and the inner ring 125b are made of the same ceramic as is used for the cover member 25.

As is shown in FIG. 11, a step portion 125i is formed around the inner circumference of the outer ring 125a to engage an outer edge 125e of the inner ring 125b. When, as is shown in FIG. 10, the outer edge 125e engages the step portion 125i, the cover member 125 is obtained that has the same external shape and the same function as has the cover member 25 in the first embodiment. At the engagement portion, whereat the outer edge 125e engages the step portion 125i, the outer diameter at the outer edge 125e is smaller than the internal diameter at the step portion 125i by a distance represented by a predetermined gap G, which is calculated based on a difference in the thermal expansion of the outer ring 125a and the inner ring 125b during the plasma process.

In FIG. 12 is shown the state wherein the cover member 125 is attached when a wafer 6B is employed for the plasma process. Specifically, the cover member 125 is attached by the engagement of the outer ring 125a with a step portion that is formed by the insulating film 26 and the upper face of the outer ring member 22. Since the inner ring 125b is so shaped that it extends inward, from the upper portion of the outer ring 125a, and covers the blocking member 9, the outer ring 125a is a thick, while the inner ring 125b is thinner than the outer ring 125a by a value obtained by adding, to the height difference of the step portion of the insulating film 26, the gap required to cover the blocking member 9. That is, the cover member 125 is formed of the thick, outer ring 125a and the thin, inner ring 125b that engages the outer ring 125a.

Since the cover member 125 is divided into the outer and inner segments, an erroneous operation may occur during the removal of the mounted cover member 125, i.e., the inner ring 125b may be removed while the outer ring 125a is not. In order to prevent such an erroneous operation, a special catch (not shown) is provided for the outer ring 125a, so that the outer ring 125a and the inner ring 125b are constantly engaged and are provided as a single unit, and the entire cover member 125 can be mounted or removed.

As in FIG. 9, when a wafer 6B is mounted, the outer circumference of the wafer 6B rests on the insulating film 27, so that a boundary C1 between the insulating film 27 and the first area 31 is completely hidden by the wafer 6B, and the second area 32, between the insulating films 26 and 27, is covered by blocking member 9 that is covered by the cover member 125. During the plasma process, the upper face of the cover member 125 is exposed to plasma, and the temperature at the cover member 125 is increased by heat generated by the plasma.

In this case, the plasma density in a discharge space 2a is not uniform, and is lower in the portion outside the electrode member 3a than in the inside portion. Therefore, as the temperature of the cover member 125 is increased by the heat produced by the plasma, a temperature difference occurs between the inside and the outside of the cover member 125. Due to this temperature difference, concerning the thermal expansion behavior of the cover member 125, the thermal displacement of the inner ring 125b is greater than that of the outer ring 125a.

At this time, as previously described, while taking the thermal expansion difference into account, a gap G is defined when the inner ring 125b engages the outer ring 125a. Therefore, when the inner ring 125b expands, it is not bound by the outer ring 125a and thermal stress does not occur. Therefore, even when an integrated cover member is provided, the cover member can be protected from being damaged due to the thermal stress that tends to be generated.

Third Embodiment

Figure 13:
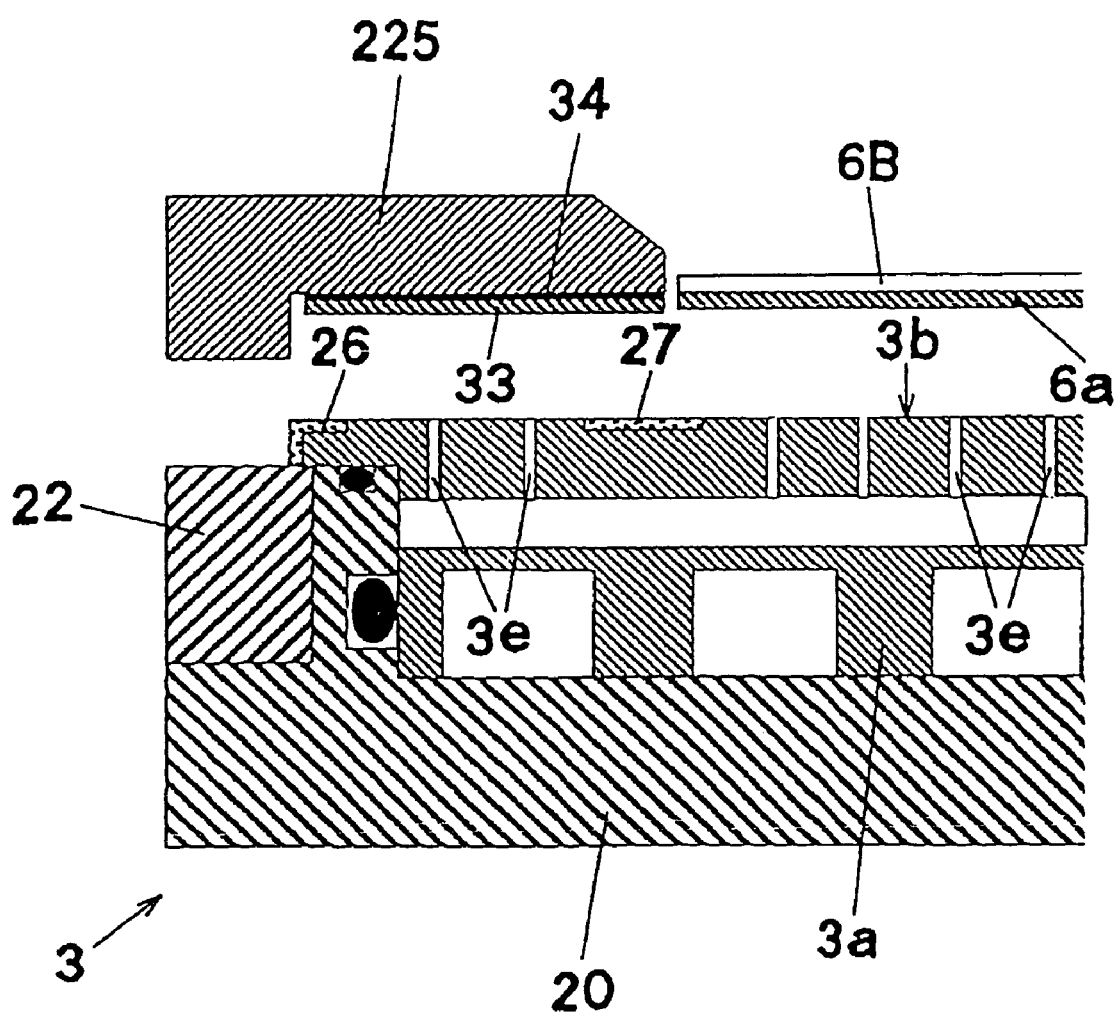
FIG. 13 is a cross-sectional view of part of the electrode member of a plasma processing apparatus according to a third embodiment of the invention.
Figure 14:
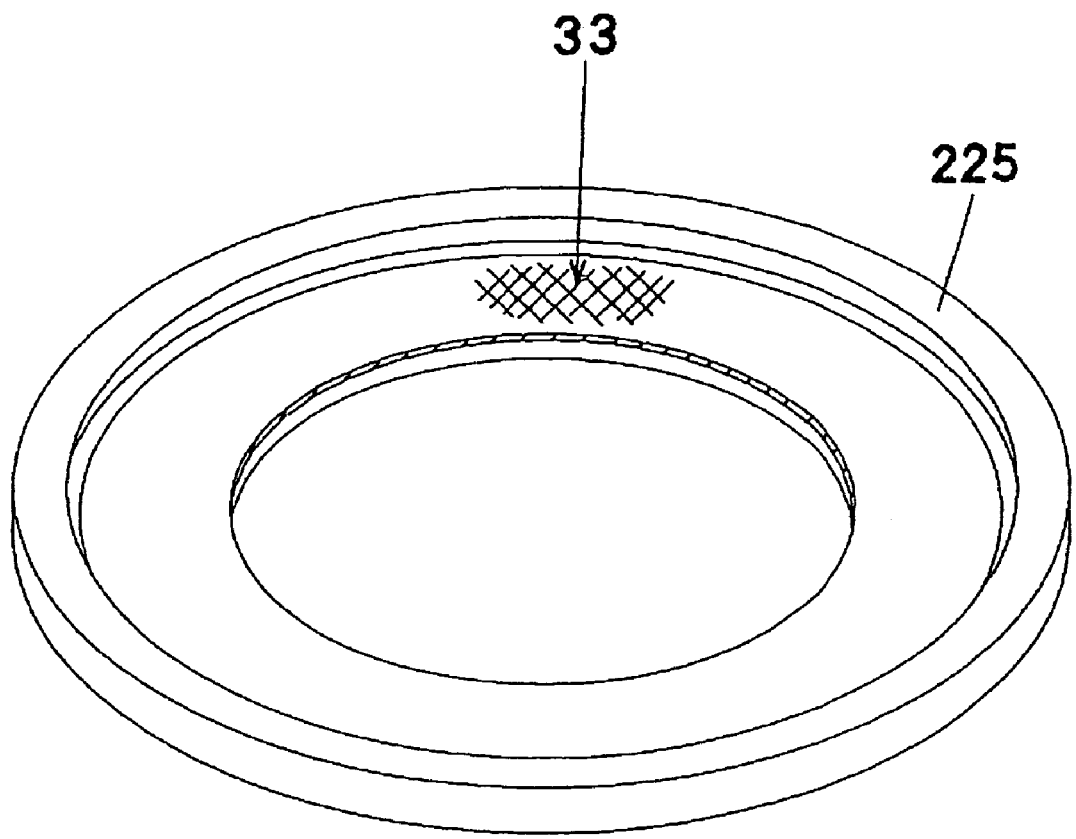
FIG. 14 is a perspective view of the cover member of the plasma processing apparatus according to the third embodiment.
Figure 15:
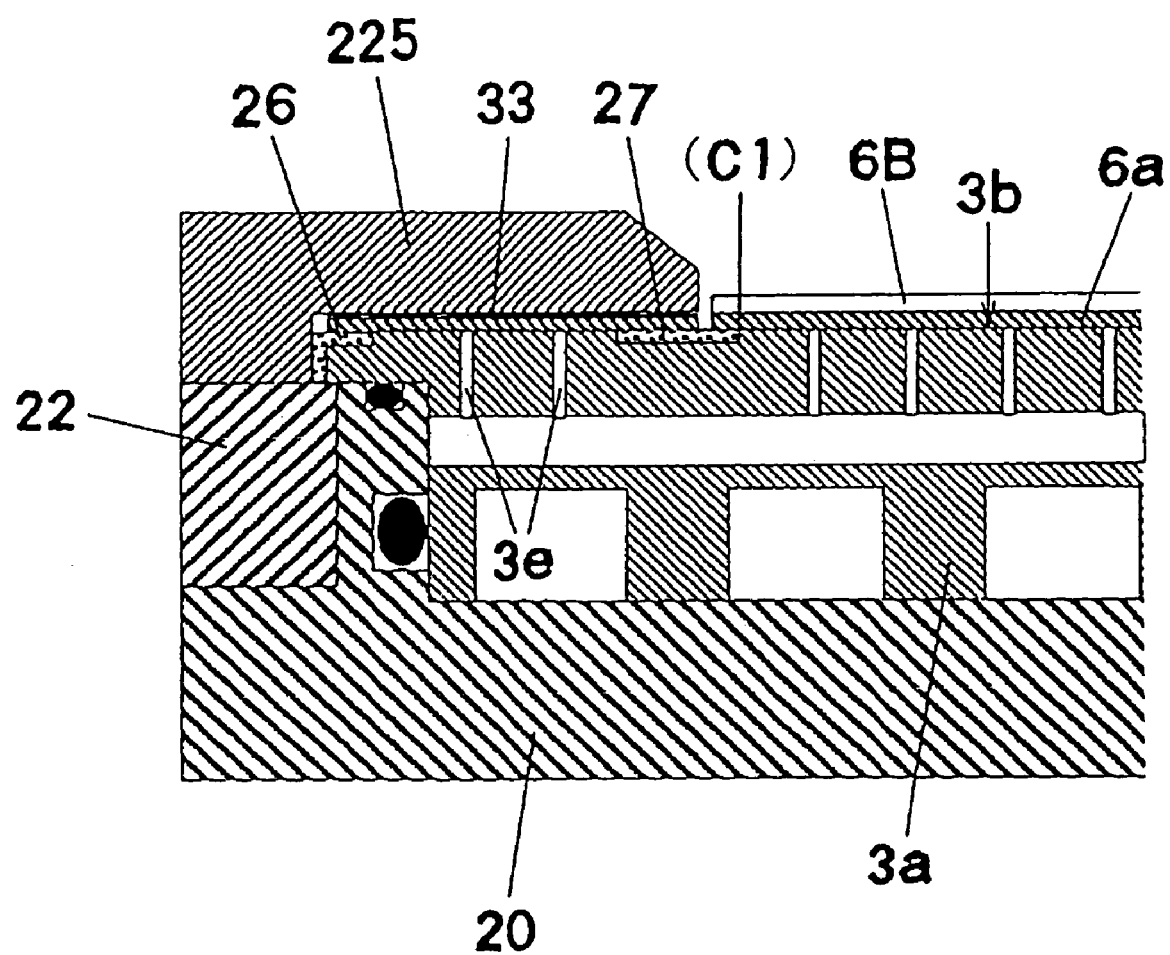
FIG. 15 is a cross-sectional view of part of the electrode member of the plasma processing apparatus according to the third embodiment.

FIGS. 13 and 15 are cross-sectional views of parts of the electrode member of a plasma processing apparatus according to a third embodiment of the invention. FIG. 14 is a perspective view of the cover member of the plasma processing apparatus according to the third embodiment. In the third embodiment, the cover member 25 of the plasma processing apparatus in the first embodiment also serves as the blocking member 9.

In FIG. 13, a first electrode 3 has the same structure as the first electrode 3 in FIG. 5 for the first embodiment, i.e., an electrode member 3a is fitted into a base 20 and an outer ring member 22 is assembled with the outer edge of the base 20. A mounting face 3b, which is the upper face of the electrode member 3a, is divided into a first area 31, a second area 32, a first insulating area 31a and a second insulating area 32a by insulating films 26 and 27 in the same manner as in the first and second embodiments. Suction holes 3e are formed in the first and second areas 31 and 32 (see FIG. 4).

In the third embodiment, when a wafer 6B is employed for the plasma process, the second area 32 and the suction holes 3e located in the second area 32 are hidden by a cover member 225 having a ring shape. To cover the suction holes 3e, the cover member 225 is shaped so that its lower face contacts the mounting face 3b when the cover member 225 is provided for the first electrode 3.

The cover member 225 is made of the same ceramic as is the cover member 25, and a resin layer 33 is adhered to the portion where the main body of the cover member 225 is to contact the second area 32. The resin layer 33 is provided by the adhesion to the cover member 225 of a resin sheet, such as a polyimide sheet, having superior heat-resistant properties, using an adhesive 34, such as an epoxy resin, that also has superior heat-resistant properties. In FIG. 14 is shown the state wherein the cover member 225, to which the resin layer 33 is adhered, is inverted. That is, the resin layer 33 is formed at the position whereat the lower face of the ceramic main body of the cover member 225 contacts the second area 32.

In FIG. 15 is shown the state wherein the cover member 225 is mounted when a wafer 6B is employed for the plasma process. Specifically, to attach the cover member 225, the outer, thick portion of the cover member 225 is fitted onto a step portion that is formed by the insulating film 26 and the upper face of the outer ring member 22. The entire inner face of the cover member 225, where the resin layer 33 is formed, contacts the mounting face 3b and completely hides the second area 32 and all the suction holes 3e formed therein.

That is, in the third embodiment, the cover member 225 is detachable from the mounting face 3b, and is ring shaped so that when mounted it can closely contact the surface of the second area 32, completely hiding the second area 32 and all the suction holes 3e formed therein. With this arrangement, a blocking member for covering the suction holes 3e in the second area 32 need not be separately prepared, and attached or removed while performing a stage replacement process. As a result, the costs and the labor required to perform a stage replacement process can be reduced.

Fourth Embodiment

Figure 16:
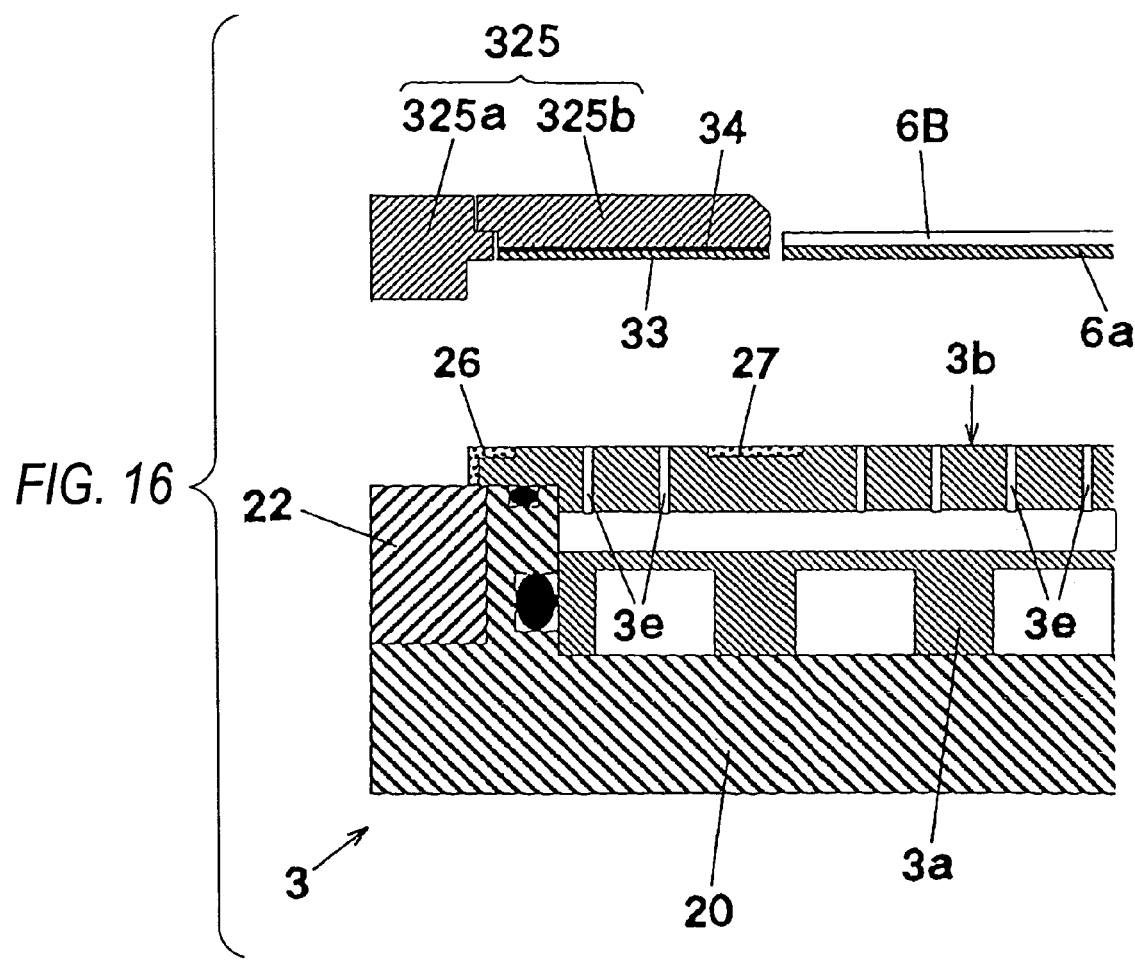
FIG. 16 is a cross-sectional view of part of the electrode member of a plasma processing apparatus according to a fourth embodiment of the invention.
Figure 17:
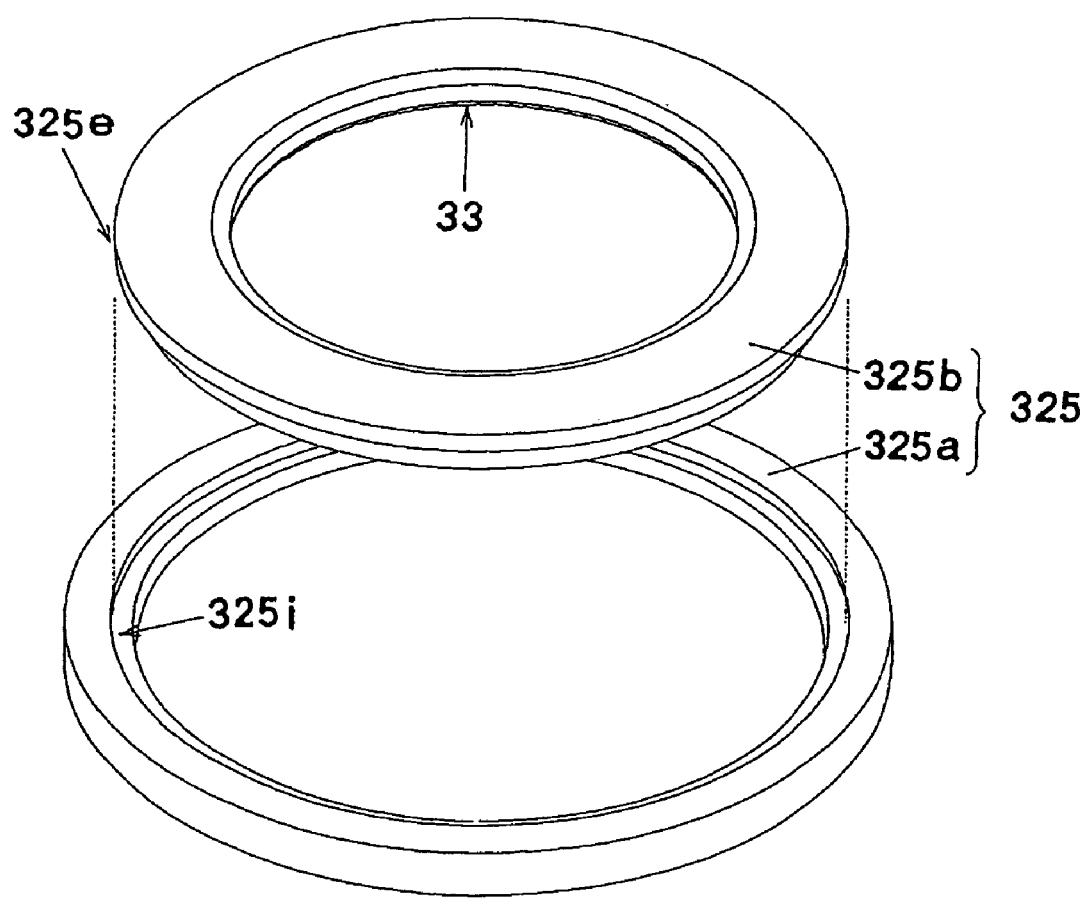
FIG. 17 is a perspective view of the cover member of the plasma processing apparatus according to the fourth embodiment.
Figure 18:
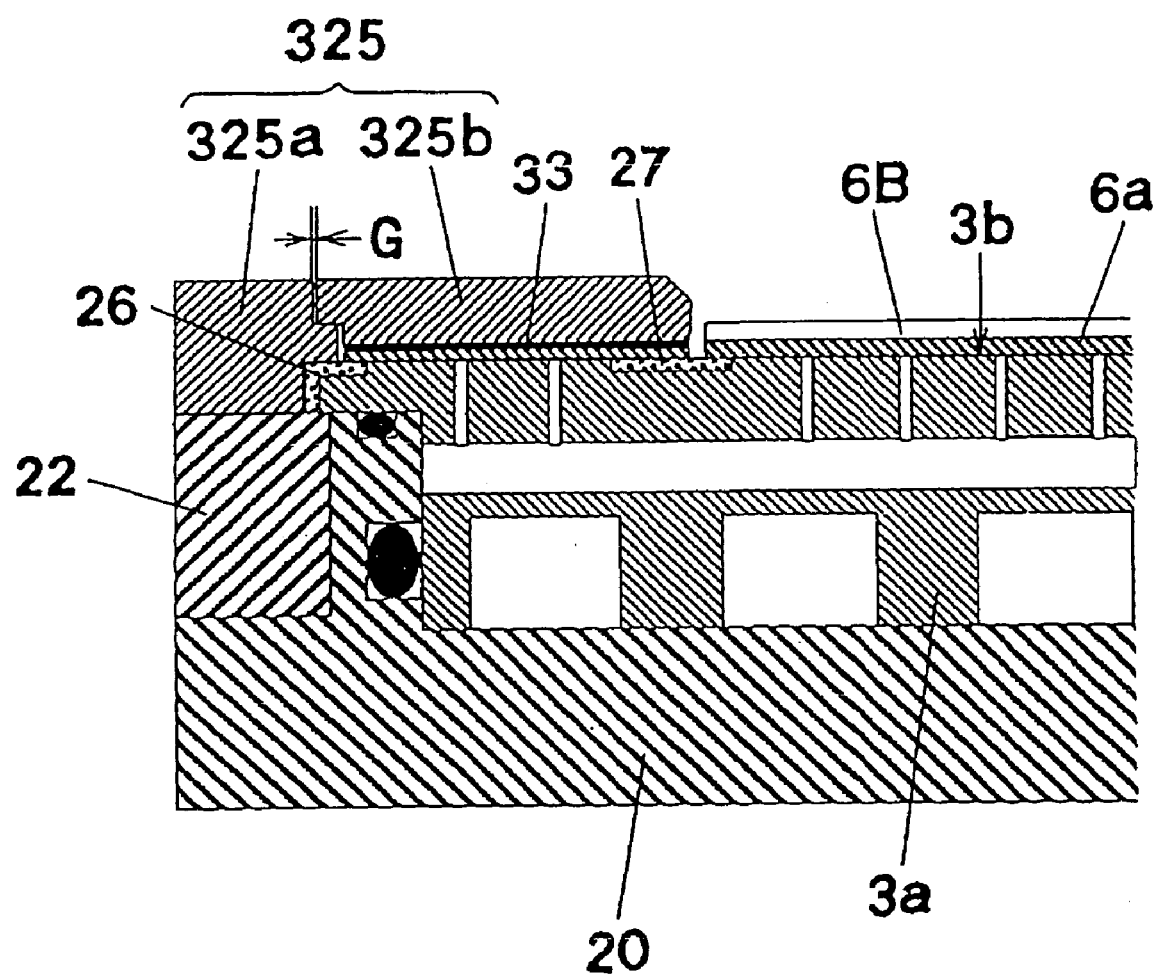
FIG. 18 is a cross-sectional view of part of the electrode member of the plasma processing apparatus according to the fourth embodiment.

FIGS. 16 and 18 are cross-sectional views of parts of the electrode member of a plasma processing apparatus according to a fourth embodiment of the present invention. FIG. 17 is a perspective view of the cover member of the plasma processing apparatus according to the fourth embodiment. In the fourth embodiment, the cover member 225 of the plasma processing apparatus in the third embodiment is divided into two rings, an inner ring and an outer ring.

In FIG. 16, a first electrode 3 has the same arrangement as has the first electrode 3 in FIG. 5 for the first embodiment, i.e., an electrode member 3a is fitted into a base 20, and an outer ring member 22 is assembled with the outer edge of the base 20. A mounting face 3b, which is the upper face of the electrode member 3a, is divided into a first area 31, a second area 32, a first insulating area 31a and a second insulating area 32a by insulating films 26 and 27, in the same manner as for the first to the third embodiments (see FIG. 4).

In the fourth embodiment, as in the third embodiment, when a wafer 6B is employed for the plasma process, the second area 32 and suction holes 3e located in the second area 32 are hidden by a cover member 325. The cover member 325 in this embodiment is obtained by dividing the cover member 225 in the third embodiment into two ring-shaped members made of the same ceramic as the cover member 225, i.e., an outer ring 325a and an inner ring 325b. A resin layer 33 is adhered to the lower face of the inner ring 325b by an adhesive 34.

As is shown in FIGS. 16 and 17, a step portion 325e is provided for the inner ring 325b to engage an inner edge 325i of the outer ring 325a. When the outer edge 325e engages the step portion 325i, the cover member 325, which has the same outer shape as the cover member 225 in the third embodiment, can be obtained. In this embodiment, as in the second embodiment, the outer diameter at the outer edge 325e is smaller than the internal diameter at the step portion 325i by a distance represented by a predetermined gap G, which is calculated by taking into account the coefficient of the thermal expansion of the inner ring 325b during the plasma process.

In FIG. 18 is shown the state wherein the cover member 325 is attached when a wafer 6B is employed for the plasma process. Specifically, to attach the outer ring 325a, the outer, thick portion is fitted onto the step portion formed by the upper face of the outer ring member 22 and the insulating film 26. A lower cover face of the cover member 325 whereon the resin layer 33 is formed contacts the mounting face 3b, while completely hiding the entire second area 32 and all the suction holes 3e located therein.

Since the inner ring 325b extends inward from the upper portion of the outer ring 325a to cover the mounting face 3b, the outer ring 325a is thick, while the inner ring 325b is thinner by a height difference of the step portion of the insulating film 26. That is, the cover member 325 is formed of the thick, outer ring 325a and the thin, inner ring 325b that engages the outer ring 325a, and the resin layer 33, for covering suction holes 3e, is so positioned on the lower face of the inner ring 325b that it contacts the second area 32.

Since the cover member 325 is divided into the inner and outer segments, as in the second embodiment, the above described erroneous operation may occur, i.e., the inner ring 325b may be removed while the outer ring 325a is not. In order to prevent this erroneous operation, a special catch (not shown) is provided for the outer ring 325a, so that the outer ring 325a and the inner ring 325b are constantly engaged and are provided as a single unit, and the entire cover member 325 can be mounted or removed.

During the plasma process, as in the previous embodiments, the upper face of the cover member 325 is exposed to plasma, and the temperature at the cover member 325 is increased by the heat produced by the plasma. At this time, since the plasma density in a discharge space 2a is not uniform, a temperature difference occurs between the inside and the outside of the cover member 325. As in the second embodiment, however, while taking into account the thermal expansion difference between the outer ring 325a and the inner ring 325b, a gap G is defined at the portion whereat the inner ring 325b engages the outer ring 325a. Thus, when the inner ring 325b expands, it is not bound by the outer ring 325a, and thermal stress does not occur. Therefore, even when an integrated cover member is provided, the cover member can be protected from being damaged due to the thermal stress that tends to be generated.

Fifth Embodiment

Figure 19:
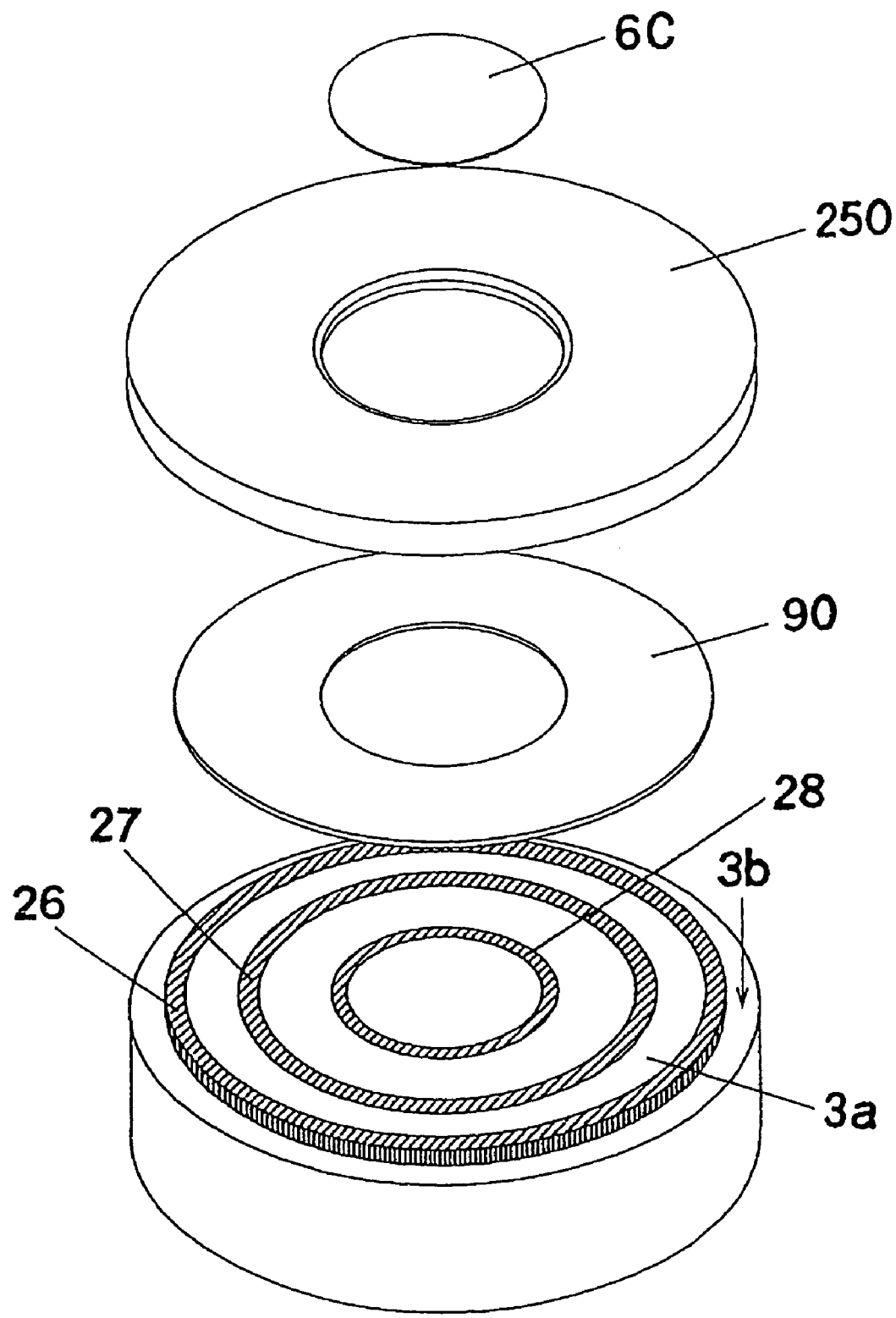
FIG. 19 is a perspective view of the electrode member of a plasma processing apparatus according to a fifth embodiment of the invention.

FIG. 19 is a perspective view of the electrode member of a plasma processing apparatus according to a fifth embodiment of the invention. While large and small wafers 6A and 6B are employed in the first to the fourth embodiments, the present invention is not limited to these two, and other wafers having different sizes may be employed. For example, as is shown in FIG. 19, when a wafer 6C that is smaller than a wafer 6B is also to be processed, an insulating area, which is covered with an insulating film 28, as are the insulating films 26 and 27, is additionally positioned on a mounting face 3b at a position corresponding to the outer circumference of the wafer 6C. Further, a cover member 250, consonant with the size of the wafer 6C, is prepared. In this case, the wafer 6C, as well as the wafer 6B, is smaller than the wafer 6A.

The cover member 250 may be provided as a single unit, like the cover members 25 and 225 in the first and the third embodiments, or may be divided into two segments, like the cover members 125 and 325 in the second and the fourth embodiments. When the cover member that is employed is one such as the cover member 25 or 125 in the first or second embodiment, whereon a resin layer is not deposited on the lower face, a blocking member 90 consonant with the size of the wafer 6C is prepared. But when the cover member that is employed is one such as the cover member 225 or 325 in the third or fourth embodiment, whereon a resin layer 33 is deposited on the lower face, a blocking member is not required, as is described above.

INDUSTRIAL APPLICABILITY

According to the present invention, a single plasma processing apparatus can easily and inexpensively handle a plurality of wafers having different sizes. Therefore, the present invention can effectively be employed for a plasma processing apparatus provided for the performance of a wafer etching process using plasma.

The invention claimed is:

1. A plasma processing apparatus, which performs a plasma process for the reverse face of a wafer for which an insulating sheet is adhered to the obverse face and which, for the plasma process, handles at least two sizes of wafer, a large wafer and a small wafer, comprising:
   an integrally formed electrode member, which is located in a process chamber that defines a closed space and which has a mounting face larger than a large wafer so that a wafer can be mounted while the insulating sheet is contacting the mounting face;
   a pressure reduction unit, for discharging a gas from the closed space to reduce pressure;
   a gas supply unit, for supplying a plasma generation gas to the closed space in which the pressure has been reduced;
   an opposing electrode, positioned opposite the electrode member;
   a plasma generator, for applying a high frequency voltage between the electrode member and the opposing electrode to set the plasma generation gas into a plasma state;
   a DC voltage application unit, for applying a DC voltage to the electrode member to electrostatically attract the wafer positioned on the mounting face;
   a cooling unit for cooling the electrode member; and
   a cover member, which has a ring shape and which is detachably covering outer portion of the mounting face, an inner diameter of the cover member being substantially equal to an outer diameter of the wafer placed on the mounting face,
   wherein the mounting face of the electrode member is divided into
      a first area, which is located in the center of the mounting face, wherein a metal, the material used for the electrode member, is exposed,
      a first insulating area, the surface of which is covered with an insulating film, that encloses, in a ring-like manner, the outer edge of the first area,
      a second area, wherein the metal is exposed, that is extended, in a ring-like manner, around the outer edge of the first insulating area, and
      a second insulating area, the surface of which is covered with an insulating film, that encloses, in a ring-like manner the outer edge of the second area, wherein the surface of the second insulating area extends to a peripheral edge of the mounting face,
   wherein a boundary between the first area and the first insulating area is designated inside the outer edge of the small wafer positioned in the center of the mounting face, a boundary between the first insulating area and the second area is designated outside the outer edge of the small wafer, and the first area and the first insulating area directly support the small wafer mounted on the insulating sheet, and wherein a boundary between the second area and the second insulating area is designated inside the outer edge of the large wafer positioned in the center of the mounting face, the second insulating area extends outward from the large wafer, and the first area, the first insulating area, the second area, and the second insulating area directly support the large wafer mounted on the insulating sheet.

2. A plasma processing apparatus according to claim 1, wherein said cover member completely covers the second area.

3. A plasma processing apparatus according to claim 2, wherein the cover member is attached to the mounting face when a small wafer is to be processed, or is removed from the mounting face when a large wafer is to be processed.

4. A plasma processing apparatus according to claim 3, further comprising:
   a plurality of suction holes formed in the first area and the second area;
   a vacuum suction unit for creating a vacuum and producing suction that, through the suction holes, draws the wafer to and holds the wafer on the mounting face; and
   a blocking member, having a ring shape, that is attached to the second area, when the cover member is mounted on the mounting face, to block the plurality of suction holes in the second area,
   wherein the cover member completely covers the blocking member.

5. A plasma processing apparatus according to claim 2, wherein the cover member is made of ceramic.

6. A plasma processing apparatus according to claim 2, wherein the cover member is formed of a thick outer ring and a thin internal ring that engages the thick outer ring.

7. A plasma processing apparatus according to claim 1, wherein the insulating film covering the first insulating area and the insulating film covering the second insulating area are made of aluminous ceramic.

8. A plasma processing apparatus according to claim 7, wherein the blocking member is formed by adhering, to one face of a ring-shaped plate made of the same material as the wafer, an insulating sheet made of the same material as the insulating sheet that is adhered to the wafer.

9. A plasma processing apparatus according to the present invention, which performs a plasma process for the reverse face of a wafer for which an insulating sheet is adhered to the obverse face and which, for the plasma process, can handle at least two sizes of wafer, a large wafer and a small wafer, comprising:
   an integrally formed electrode member, which is located in a process chamber that defines a closed space and which has a mounting face larger than a large wafer so that a wafer can be mounted while the insulating sheet is contacting the mounting face;
   a pressure reduction unit, for discharging a gas from the closed space to reduce pressure;
   a gas supply unit, for supplying a plasma generation gas to the closed space in which the pressure has been reduced;
   an opposing electrode, positioned opposite the electrode member;
   a plasma generator, for applying a high frequency voltage between the electrode member and the opposing electrode to set the plasma generation gas into a plasma state;
   a DC voltage application unit, for applying a DC voltage to the electrode member to electrostatically attract the wafer positioned on the mounting face; and
   a cooling unit for cooling the electrode member,
   wherein the mounting face of the electrode member is divided into
      a first area, which is located in the center of the mounting face, wherein a metal, the material used for the electrode member, is exposed,
      a first insulating area, the surface of which is covered with an insulating film, that encloses, in a ring-like manner, the outer edge of the first area,
      a second area, wherein the metal is exposed, that is extended, in a ring-like manner, around the outer edge of the first insulating area, and
      a second insulating area, the surface of which is covered with an insulating film, that encloses, in a ring-like manner, the outer edge of the second area, wherein the surface of the second insulating area extends to a peripheral edge of the mounting face,
   wherein a boundary between the first area and the first insulating area is designated inside the outer edge of the small wafer positioned in the center of the mounting face, a boundary between the first insulating area and the second area is designated outside the outer edge of the small wafer, and the first area and the first insulating area directly support the small wafer mounted on the insulating sheet,
   wherein a boundary between the second area and the second insulating area is designated inside the outer edge of the large wafer positioned in the center of the mounting face, the second insulating area extends outward from the large wafer, and the second insulating area is located outside the outer edge of the large wafer, and the first area, the first insulating area, the second area, and the second insulating area directly support the large wafer mounted on the insulating sheet,
   wherein a plurality of suction holes are formed in the first and the second areas and a vacuum suction unit is provided to create a vacuum and produce suction that, through the suction holes, draws the wafer to and holds the wafer on the mounting face, and
   wherein a cover member, which has a ring shape and which is detachable from the mounting face, is closely adhered across the entire face of the second area to completely cover all the suction holes formed in the second area.

10. A plasma processing apparatus according to claim 9, wherein the cover member is attached to the mounting face when a small wafer is to be processed, or is removed from the mounting face when a large wafer is to be processed.

11. A plasma processing apparatus according to claim 9, wherein the cover member has a main body made of ceramic, and a resin layer is deposited at a location, on the lower face of the main body, that contacts the second area.

12. A plasma processing apparatus according to claim 9, wherein the cover member has an outer ring and an internal ring that engages the outer ring, and a resin layer is deposited at a location, on the lower face of the inner ring, that contacts the second area.

13. A plasma processing apparatus according to claim 9, wherein the insulating film covering the first insulating area and the insulating film covering the second insulating area are made of aluminous ceramic.

* * * * *